(12) United States Patent
Carpenter et al.

(10) Patent No.: US 12,276,017 B2
(45) Date of Patent: Apr. 15, 2025

(54) ENGINEERED MULTI-DIMENSIONAL METALLURGICAL PROPERTIES IN PVD MATERIALS

(71) Applicant: Vactronix Scientific LLC, Fremont, CA (US)

(72) Inventors: Scott P. Carpenter, Fremont, CA (US); Tianzong Xu, San Ramon, CA (US); Harshal Surangalikar, San Jose, CA (US)

(73) Assignee: VACTRONIX SCIENTIFIC, LLC, San Antonio, TX (US)

( * ) Notice: Subject to any disclaimer, the term of this patent is extended or adjusted under 35 U.S.C. 154(b) by 703 days.

(21) Appl. No.: 17/327,667

(22) Filed: May 21, 2021

(65) Prior Publication Data

US 2022/0372610 A1    Nov. 24, 2022

(51) Int. Cl.
*C23C 14/16* (2006.01)
*C22C 14/00* (2006.01)
(Continued)

(52) U.S. Cl.
CPC ............ *C23C 14/165* (2013.01); *C22C 14/00* (2013.01); *C23C 14/024* (2013.01); *C23C 14/34* (2013.01);
(Continued)

(58) Field of Classification Search
CPC .................................................. C23C 14/165
See application file for complete search history.

(56) References Cited

U.S. PATENT DOCUMENTS

| 4,430,183 A | 2/1984 | Schuller et al. |
| 2003/0059640 A1* | 3/2003 | Marton ................... A61L 31/16 29/17.2 |

(Continued)

FOREIGN PATENT DOCUMENTS

WO    2010110883 A1    10/2010

OTHER PUBLICATIONS

Cobal, Co', MatWeb, Feb. 22, 2023, date retrieved) [Retreived from Internet Feb. 22, 2023 (Feb. 22, 2023) at https://www.matweb.com/search/DataSheet.aspx?MatGUID=4602449fc566494ab3efa286e8827c99].

(Continued)

*Primary Examiner* — John J Brayton
(74) *Attorney, Agent, or Firm* — Rosenbaum IP, P.C.; David G. Rosenbaum

(57) ABSTRACT

Multi-layer metal or pseudometallic materials having engineered anisotropy are disclosed. The multi-layer materials having defined engineered grain orientations in each layer of the multi-layer material and bond layers between adjacent layers orthogonal to the grain orientations. This configuration distributes applied stress across the plurality of layers in the multi-layer metal material and around a neutral axis of the multi-layer metal material and increases the overall mechanical properties of the disclosed multi-layer metal material relative to conventional wrought metal materials of the same or similar chemical constitution. The microstructure of each layer, group of layers, or across multiple layers may be tailored to the intended application of a device made from the material. Individual layers may be tuned for property variations, such as gradients, or to adjust the bond layer characteristics. A method of making the multi-layer metal materials by physical vapor deposition to deposit each layer as crystalline grain structures and allow for layer-by- (Continued)

layer control over the physical, mechanical and chemical properties of each layer in the multi-layer metal as well as a bond layer between adjacent layers is disclosed.

25 Claims, 23 Drawing Sheets

(51) Int. Cl.
    C23C 14/02    (2006.01)
    C23C 14/34    (2006.01)
    C23C 14/50    (2006.01)
    C23C 14/54    (2006.01)
    C23C 14/58    (2006.01)
(52) U.S. Cl.
    CPC .......... *C23C 14/505* (2013.01); *C23C 14/542* (2013.01); *C23C 14/58* (2013.01); *C22C 2200/00* (2013.01)

(56) References Cited

U.S. PATENT DOCUMENTS

| 2006/0139799 | A1* | 6/2006 | Wu | G11B 5/66 |
| 2012/0315502 | A1* | 12/2012 | Nitta | C25D 5/12 |
| | | | | 428/665 |
| 2017/0151053 | A1 | 6/2017 | Marton | |

OTHER PUBLICATIONS

Nickel, Ni', MatWeb, (Feb. 22, 2023, date retrieved) [Retreived from Internet Feb. 22, 2023, (Feb. 22, 2023) at https://www.matweb.com/search/DataSheet.aspx?MatGUID=e6eb83327e534850a062dbca3bc758dc].

Notification of Transmittal of the International Search Report and the Written Opinion of the International Searching Authority, of the Declaration. PCT/US2022/034050 Dated Nov. 29, 2022.

Written Opinion of the International Searching Authority, PCT/US2022/034050 Dated Nov. 29, 2022.

* cited by examiner

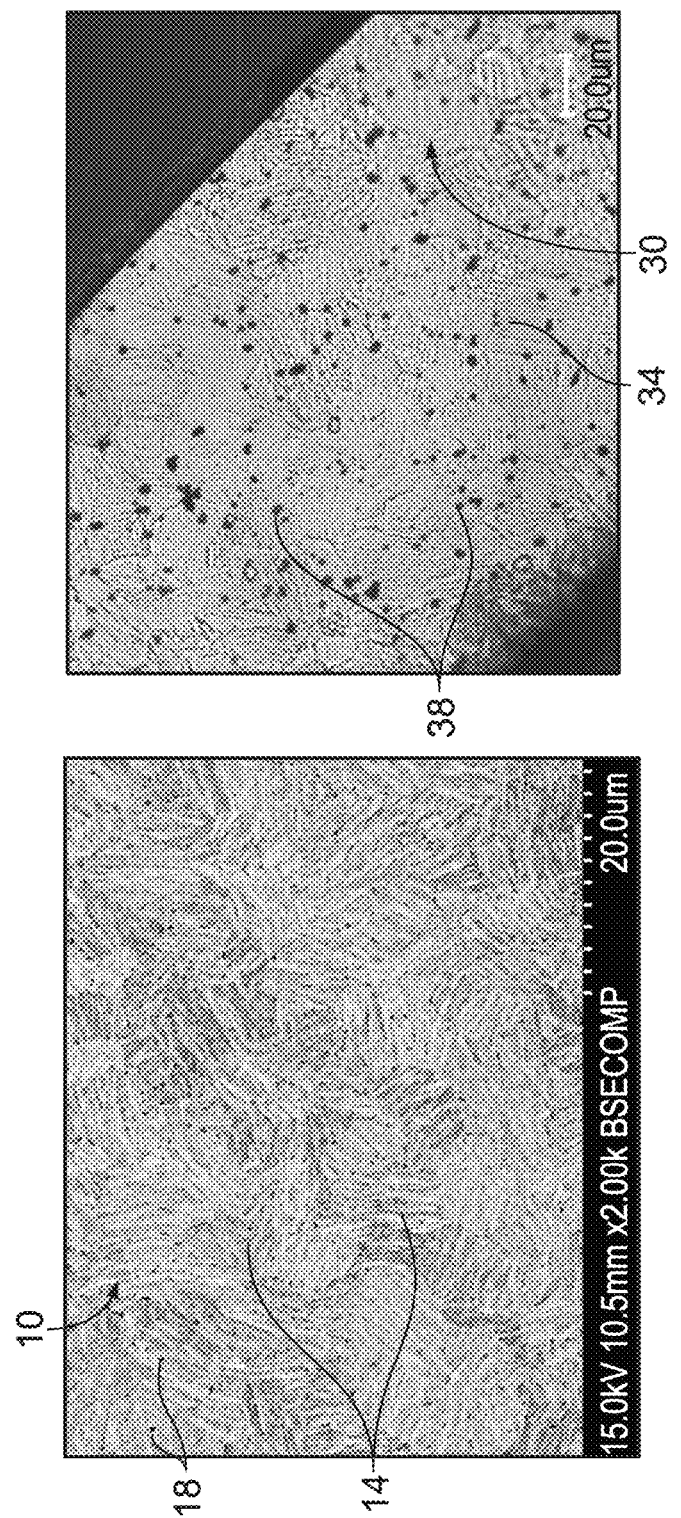

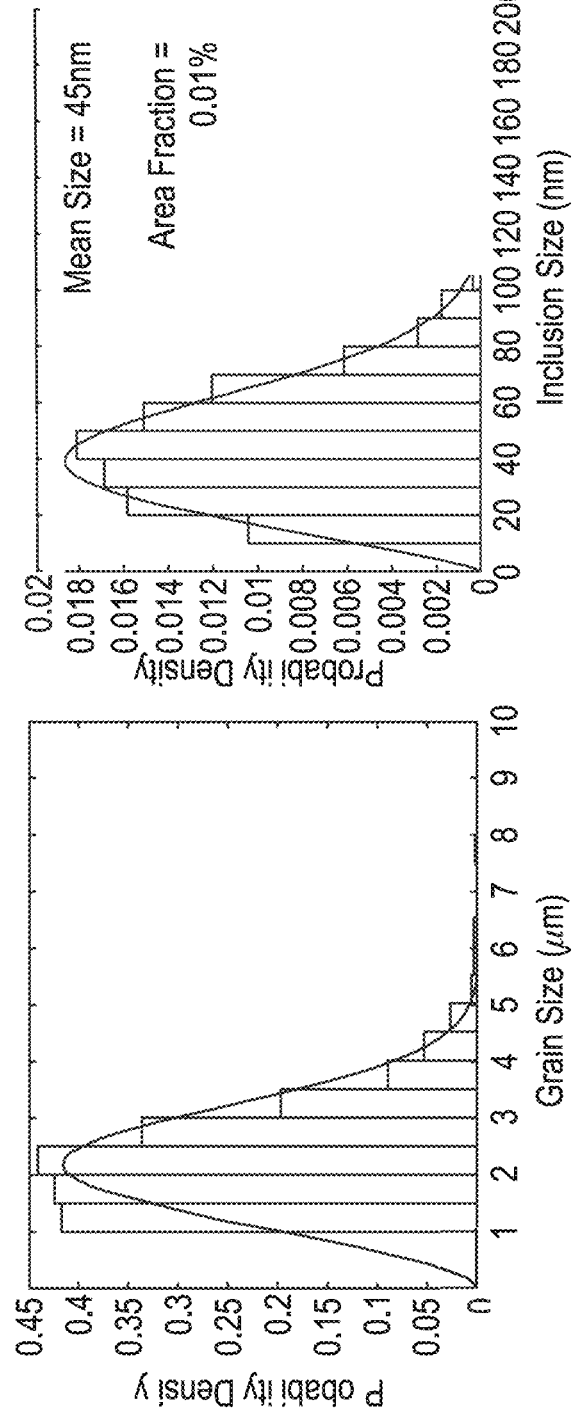
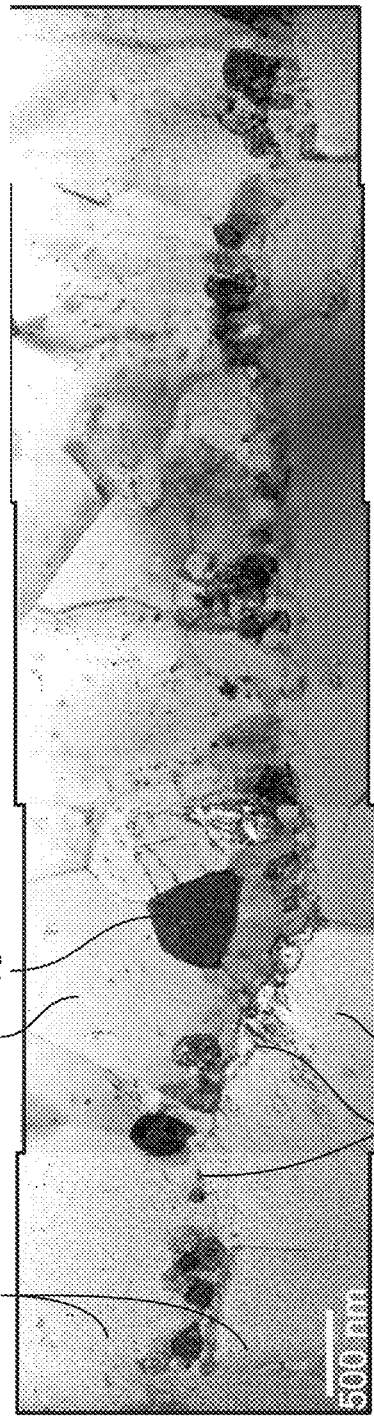
FIG. 3A
FIG. 3B
FIG. 5

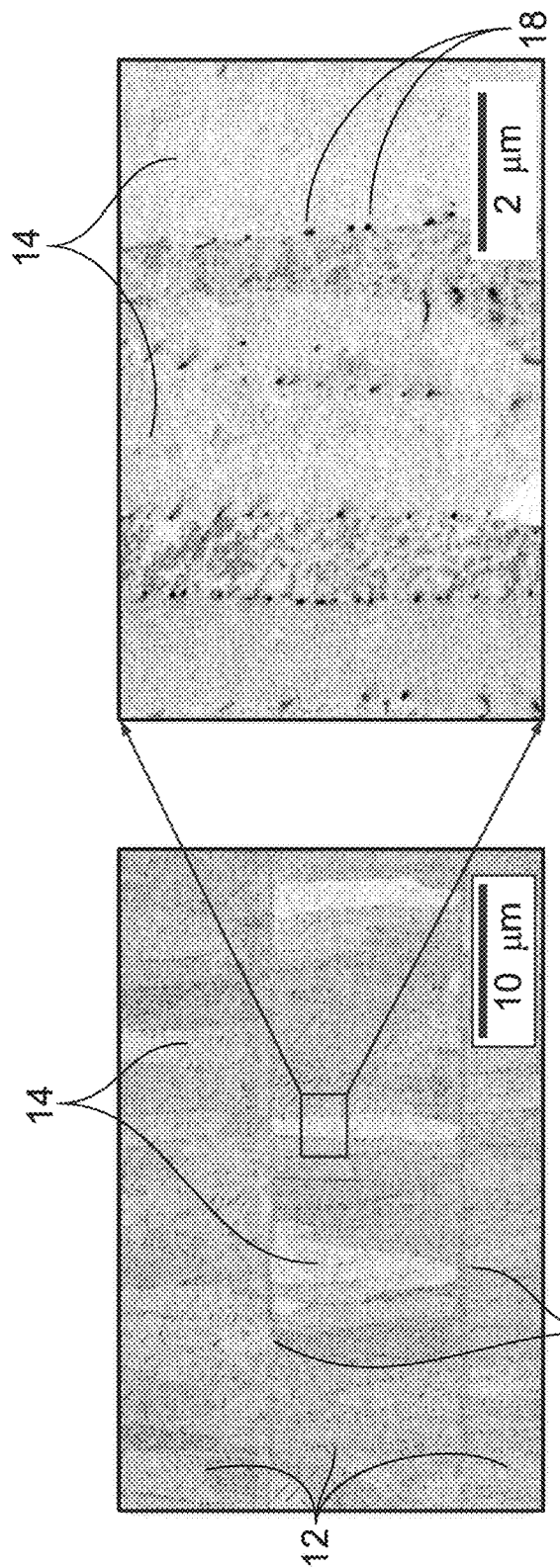

ENGINEERED MULTI-DIMENSIONAL METALLURGICAL PROPERTIES IN PVD MATERIALS

BACKGROUND OF THE INVENTION

The engineered materials of the present disclosure are made as multi-layer materials having defined engineered grain orientations in each layer of the multi-layer material. Bond layers, synonymously, interfacial regions are orthogonal to the orientation of the material grains and are present at the interface between adjacent layers of the multi-layer material. The bond layers join adjacent crystalline grain layers and serve to disburse shear stress across the bond layers and individual layers of the multi-layer material. The properties of the bond layer are also controllable to configure the bond layers to have stronger or weaker adhesion of the adjacent layers. In this manner, the engineered materials of the present disclosure are tailored to control the orientation of shear stresses relative to layer build direction in a manner that is determined by the specific application or use of the material. The engineered materials may be fashioned into structures adapted to specific intended uses.

More particularly, the engineered materials of the present invention may be made as metal sheets, films, foils, wires or seamless tubes, with defined crystalline grain orientation that yields an engineered anisotropy both within each layer and in the whole of the engineered material. The inventive engineered materials have mechanical properties that differ significantly from wrought materials and which are suitable for use in fabricating a wide variety of devices, including, for example, implantable medical devices, for example, endoluminal grafts, stentgrafts, stent-graft-type devices, filters, such as vena cava filters or embolic filters, cardiac valve frames, and other tubular or net shaped medical devices. Conventional medical devices, such as stents, are typically longitudinally flexible and radially stiff. Stents made of wrought metal tubing inherently have the opposite properties, i.e., they are radially pliant and longitudinally inflexible. As a result of cold working of wrought metal tubing, such as drawing, conventional stents exhibit a grain orientation that is parallel to the longitudinal axis of the stent and results in longitudinal stiffness and radial weakness.

A significant aspect of the disclosed material lies in the ability to engineer predetermined physical and mechanical properties in the material that are engineered taking into account optimization for the stress and strain profiles imposed by the design and function of a device that the material is used to fabricate. This is achieved by physical vapor deposition (PVD) fabrication of the disclosed material while controlling the PVD process parameters to deposit crystalline materials having defined crystal grain morphologies, material composition, and low volume and nanometer scale intragranular inclusions, each of which may be varied on a layerby-layer basis or be substantially uniform across plural layers of the deposited material.

PVD fabrication of the inventive engineered materials allows for tight control over the physical and chemical properties of resulting PVD deposited materials. PVD generally refers to a process in which a metal vapor is generated from a solid metal target, and the metal vapor is then deposited on a substrate material as a highly coherent pure or alloy metal. PVD is carried out in a vacuum chamber and results in deposition of the metal species simultaneously over the entire substrate rather than in localized areas. An inert gas is introduced into the vacuum chamber and a plasma is created around the substrate that bombards the solid metal target to dislodge metal atoms from the solid metal target into the metal vapor, then the plasma bombards the substrate and the forming metal solid on the substrate with those metal atoms to produce the coherent pure metal or metal alloy deposited material on the substrate. PVD deposition of nonmetals, such as polymers or ceramics, may also be employed.

As opposed to wrought materials that are made of a single metal or alloy forming a bulk material, the inventive PVD fabricated engineered materials are made of at one or more layers with the interface or bond region between each pair of layers and/or between a first layer and a substrate. Each layer may have a thickness between about 2 micrometers and about 25 micrometers, with the total thickness of the engineered material being between about 10 micrometers to about 500 micrometers. Multi-layer structures are generally known to increase the mechanical strength of sheet materials, such as wood or paper products. Multi-layers are used in the field of thin and thick film fabrication also to increase the mechanical properties of the thin or thick film, specifically hardness and toughness. Multi-layer metal foils have not been used or developed principally because conventional metal forming technologies, such as, for example, rolling and extrusion do not readily lend themselves to producing multi-layer structures with bond or interface regions oriented orthogonally to the grain structure. Vacuum deposition technologies have been developed to yield multi-layer metal structures with columnar crystalline grains grown in the build or Z-axis and a bond layer oriented orthogonally to the build or Z-axis of the columnar crystalline grains and exhibiting mechanical and physical properties that are tailored to the function and design of the device in which the material is intended to be used. In addition, multi-layer structures can be designed to provide special qualities by including layers that have special properties such as super-elasticity, shape memory, radio-opacity, corrosion resistance, etc. or combinations thereof.

Metal sheets, foils, wires and tubes are typically produced from ingots in a series of hot or cold forming steps that include some combination of rolling, pulling, extrusion and other similar processes. Each of these processing steps is accompanied by auxiliary steps that include cleaning the surfaces of the material of foreign material residues deposited on the material by the tooling and lubricants used in the metal forming processes. Additionally, chemical interaction with tooling and lubricant materials and ambient gases also introduces contaminants. Some residue will usually remain on the surface of the formed material, and there is a high probability that these contaminating residues become incorporated during subsequent processing steps into the bulk of the wrought metal product. With decreasing material product size, the significance of such contaminating impurities increases. Specifically, a greater number of process steps, and, therefore, a greater probability for introducing contaminants, are required to produce smaller product sizes.

Moreover, with decreasing product size, non-metal or other foreign inclusions become greater in size, density and frequency. This effect is particularly important for material thicknesses that are comparable to the grain or inclusion size. For example, austenitic stainless steels have typical grain sizes on the order of magnitude of 10-100 micrometer. When a wire, tube, sheet, or foil with a thickness in this range is produced, there is significant probability that some grain boundaries or defects will extend across a large portion or even across the total thickness of the product. Such products will have locally diminished mechanical, fatigue resistance, and corrosion resistance properties. While corrosion resistance is remedied by surface treatments such as electropolishing, the mechanical properties, including fatigue resistance, are far more difficult to control during fabrication of devices from wrought materials.

The mechanical properties of metals depend significantly on, among other things, their material morphology, chemical composition, and the crystalline or amorphous state of the metal. The forming and shaping processes conventionally employed to fabricate metal sheets, foils, wires and seamless tubes involves heavy deformation of a bulk material, which results in a heavily strained and deformed grain structure. Even though annealing treatments may partially alleviate the grain deformation, it is typically impossible to revert to well-defined grain structure and a large range of grain sizes is a common result. The end result of conventional forming and shaping processes, coupled with annealing, typically results in non-uniform grain structure and less favorable mechanical properties in smaller sized wrought metal products.

By using PVD fabrication, high quality materials may be manufactured for high-precision applications, such as micromechanical devices and medical devices, in which the materials are formed directly in the desired geometry, e.g., planar, tubular, complex three-dimensional shapes, etc. during the deposition process.

During PVD, the rate of film growth is a significant parameter of vacuum deposition processes. In order to deposit materials that can be compared in functionality with wrought metal products, deposition rates in excess of 1 micrometers/hour and rates as high as 100 micrometers per hour are desirable to deposit crystalline grains having a columnal structure. Depending on other deposition parameters, the columns may be amorphous or crystalline but at such high deposition rates, microcrystalline structure development can be expected at best. The difficulty is that the columns, particularly where the columns become larger and/or have high aspect ratios, can provide a mechanically weak structure in which crack propagation can occur uninhibited across the whole thickness of the deposit.

An advantage of vacuum deposition technologies is that it is possible to deposit layered materials with the resulting deposited films being characterized by pre-selected mechanical, physical and chemical qualities. (See, e.g., H. Holleck, V. Schier: "Multilayer PVD coatings for wear protection", *Surface and Coatings Technology*, Vol. 76-77 (1995) pp. 328-336). Layered materials, such as superstructures or multilayers, are commonly deposited to take advantage of some chemical, electronic, or optical property of the material as a coating; a common example is an antireflective coating on an optical lens.

Multi-layer coatings may have improved mechanical properties compared with similar coatings made of a single layer. Single layer coatings or materials will distribute applied stress across the entire grain structures. In contrast, the inventive multi-layer material having plural layers and bond layers between adjacent layers, distributes applied stress as shear stress at each bond layer and layer, with increasing tension or compression (depending upon the vector of the applied stress) perpendicular to the neutral axis of the multi-layer material. This stress distribution occurs where the interface region provides a slip plane, is plastic, or may delaminate locally. This property of multilayer films has been recognized in regard with their hardness, but this recognition has not been translated to other mechanical properties that are significant for metal products that may be used in application where they replace wrought metal parts.

Some relationships between PVD process parameters and the material and/or physical properties of the resultant deposited material are known in the art. For example, in 1974 J. A. Thornton applied the structure zone model for the description of thin film morphologies to sputter deposition. Thornton, in Thornton, J. A. *Influence of apparatus geometry and deposition conditions on the structure and topography of thick sputtered coatings. J. Fac. Soc. and Tech.* 11, 666 (1974) https://doi.org/10.1116/1.1312732, introduced a structure zone T, which was observed at low argon pressures and characterized by densely packed fibrous grains. Thornton identified deposition chamber pressure P as the decisive process parameter. In particular, where if hyperthermal techniques like sputtering etc. are used for the sublimation of source atoms, the pressure governs via the mean free path the energy distribution with which they impinge on the surface of the growing film. Deposition temperature $T_d$ was also identified as a determining process parameter on the morphology of the deposited thin film. Thornton's structure zone model has conventionally become known as the "Thornton diagram." According to the Thornton diagram, the morphology of the deposited material, i.e., Cu and Al-alloy materials, is dependent upon argon pressure and substrate temperature expressed as $T/T_m$ where T is the substrate temperature and $T_m$ is the coating material melting point in degrees Kelvin, the relationship is expressed as $T_d=T/T_m$. Thornton found that columnar structures tended to be formed at the highest $T/T_m$ values. This zone in which columnar grain morphologies are formed is now commonly referred to as Zone 2 in the Thornton diagram.

Anders, A., *A structure zone diagram including plasma-based deposition and ion etching*, Thin Solid Films, 518 (2010) 4087-4090, presented an extended structure zone diagram from that presented by Thornton, that recognized a myriad of other process factors at play in determining material grain morphology than the chamber pressure and substrate pressure of Thornton. Specifically, Anders extended the Thornton diagram to take into consideration a generalized temperature measurement that includes a homologous temperature plus a temperature shift caused by the potential energy of particles arriving on the substrate surface, to replace a linear pressure axis with a logarithmic axis for normalized energy describing displacement and heating effects caused by the kinetic energy of bombarding particles, and replacing the unlabeled Z-axis of the Thornton diagram with a net film thickness to account for thickness reduction by densification and sputtering. While both the Thornton diagram and the extended Thornton diagram proposed by Anders offer some guidance to determining relationships between PVD process parameters and the deposited material morphology, Anders recognized that the extended Thornton diagram was an "approach to a big-picture processmicrostructure order, which can be overwhelmingly complex, can help to grasp the overarching tendencies and provide general ideas for process modifications . . . the proposed extension stresses the generalization of energy axes and objects to the use of primary plasma-related deposition parameters . . . ." Anders at p. 4090. Thus, both the Thornton diagram and the extended Thornton diagram proposed by Anders are intended as suggestive generalizations for process modifications and are not guideposts or explicit teachings of the process-structure relationships.

A technological step that interrupts the film growth results in discontinuous columns and prevents crack propagation across the entire film thickness. In this sense, it is not necessary that the structure consist of a multiplicity of chemically distinct layers, as it is common in the case of thin film technology where multilayers are used. Such chemical differences may be useful and may contribute to improved properties of the materials.

As a non-limiting example, the present disclosure will refer to materials suitable for making medical devices, such as, for example, indwelling and/or implantable medical devices. It will be understood, however, that it is not the applicant's intent nor desire to limit the scope of the inventive to materials used in fabrication of medical devices. To the contrary, it is envisioned that the methods and materials of the present disclosure are at least equally applicable to engineered materials having grain structures, bulk material morphology, and corrosion and fatigue resistance optimized for the product or device end-use, including product or device use environment, physical and or chemical conditions that the product or device is designed for, and the stress and strain profiles that the end product or device will experience in such use environment.

Current metal materials employed in fabrication of implantable medical devices, such as stents, are typically made from bulk metals made by conventional methods which employ many steps that introduce processing aides to the metals used to make stent precursors, such as hypotubes. For example, olefins trapped by cold drawing and transformed into carbides or elemental carbon deposit by heat treatment, typically yield large carbon rich areas in 316L stainless steel tubing manufactured by cold drawing process. The conventional stents have marked surface and subsurface heterogeneity resulting from manufacturing processes (friction material transfer from tooling, inclusion of lubricants, chemical segregation from heat treatments). This results in formation of surface and subsurface inclusions with chemical composition and, therefore, reactivity different from the bulk material. Oxidation, organic contamination, water and electrolytic interaction, protein adsorption and cellular interaction may, therefore, be altered on the surface of such inclusion spots.

Unpredictable distributions of inclusions such as those mentioned above provide unpredictable and uncontrolled heterogeneous surface available for interaction with proteins and cells. Specifically, these inclusions interrupt the regular distribution pattern of surface free energy and electrostatic charges on the metal surface that determine the nature and extent of plasma protein interaction. Plasma proteins deposit nonspecifically on surfaces according to their relative affinity for polar or non-polar areas and their concentration in blood. A replacement process known as the Vroman effect, Vroman L., *The importance of surfaces in contact phase reactions*, Seminars of Thrombosis and Hemostasis 1987; 13(1): 79-85, determines a sequential replacement of predominant proteins at an artificial surface, whereby the residence time is surface affinity-dependent. Starting with albumin, following with IgG, fibrinogen and ending with high molecular weight kininogen. Typically, proteins with lowest concentration have the highest affinity and end up colonizing all available adhesive sites on the surface. Also, high affinity, low concentration plasma proteins express ligands for cell receptor attachments and, therefore, form cell adhesive sites. Examples are: fibrinogen glycoprotein receptor IIbIIIa for platelets and fibronectin RGD sequence for many blood activated cells. Since the coverage of an artificial surface with endothelial cells is a favorable end-point in the healing process, favoring endothelialization by orderly adhesive protein distribution on a device surface is desirable in implantable vascular device manufacturing. Conversely, the presence of glass, ceramics, carbides and other materials form non-adhesive foci and, therefore interrupt cell colonization.

Heretofore, however, it has been unknown to engineer crystal grain orientation in a bulk sputter deposited material in which the crystal grain orientation is orthogonal to the inner and/or outer surfaces of the deposited material. Furthermore, in multi-layer sputter deposited materials, the crystal grain orientation is orthogonal to interface bond regions between adjacent layers in the multi-layer material structure. That is, for example, in a tubular multi-layer structure, each of the layers will be concentric relative to each other, as is the interface bond region between adjacent layers of the tubular structure. By engineering the crystal grain structure to have an orthogonal orientation relative to the interface bond region and/or the inner and/or outer surfaces of the tubular multi-layer structure, the crystal grains have a radial orientation relative to the tube. Similarly, in planar multi-layer structures, the crystal grain structure will also be orthogonal to the interface bond region.

Metals, in general, are isotropic insofar their physical properties. When a material is isotropic, its strength, elastic behavior and fatigue resistance are equal in all three orthogonal directions, i.e., x, y and z directions. This equivalence of strength, elastic behavior and fatigue resistance in the three orthogonal directions is known as orthotropic isotropy. In contrast, where two of the directions, e.g., x and y directions, are equal in performance and the third direction, e.g., the z direction, is different then, the material is known as transversally anisotropic.

Anisotropy is typically defined by Hooke's law which states that the strain of a material is proportional to the applied stress within the elastic limit of the material. Mechanical properties, and therefore the isotropic or anisotropic nature of a metal material, depend largely on the crystal grain arrangement, shape symmetry and orientation. Size and shape of the crystal grains influence the properties with small size crystals resulting in greater strength as opposed to large ones because of comparatively larger total intergranular area. Uniformity of crystalline structure determines predictability and uniformity in mechanical parameters from point to point in a given volume. Anisotropy is one of those parameters. For example, roll working and drawing through dies causes metal anisotropy insofar as grain and intergranular boundaries become aligned in the direction of process deformation.

In wire and tubing manufacturing, the drawing or calendaring results in grain elongation along the longitudinal axis and increases the strength and elastic modulus along this same axis as compared with the circumferential plane. In the case of tubing, radial strength or resistance to lateral compression is comparatively smaller to those in the axial direction. Since columnar grains are roughly parallel to each other, so are the intergranular boundaries between adjacent grains. Since grain cohesion depends on intermolecular forces, this arrangement favors fracture propagation and grain separation, particularly when inclusions accumulate in the boundaries weakening the inter-grain bonds. This is problematic in devices made from drawn tubing which has grains oriented substantially parallel to the longitudinal axis of the drawn tubing. Since the most important mechanical properties of the final tubular structure are radial elasticity, radial strength and resistance to fatigue failure, a grain orientation that is parallel to the longitudinal axis is contrary to optimizing these important mechanical properties. Instead, it is recognized that crystal grain orientations that are orthogonal to the longitudinal axis of the tubular material optimizes these same mechanical properties.

SUMMARY OF THE INVENTION

To solve the inherent weaknesses of drawn tubing as a base stock material tubular or annular devices, such as intravascular stents, cardiac valves, capsulotomy rings, etc., PVD, such as sputter deposition, using a peripheral cathode vacuum chamber was employed to form tubing. One or more cylindrical or tubular substrates are mounted centrally in the vacuum chamber on a rotational fixture to rotate the substrate(s) about its longitudinal axis either individually or planetarily. One or more targets are positioned in the vacuum chamber and surrounding the substrate, preferably equidistant from the substrate. The targets may be elemental metals or alloy metals or combinations of the same, selected to achieve the stoichiometry of the resulting tubular base stock material for the intended device.

By employing PVD, tight control over a number of process parameters is possible to achieve not only deposition of crystalline or amorphous metals, as deposited, but also to control crystal grain morphology, crystal grain orientation, intragranular boundaries, and reduce intragranular precipitates. Controllable PVD process parameters include, for example, vacuum chamber pressure, plasma pressure, chamber temperature, plasma temperature, power applied to the cathode, electrical bias applied to the substrate, inert gas pressure, inert gas species and/or deposition rate. Of course, the construction and geometry of the peripheral cathode vacuum chamber will also have a significant effect on the resulting deposited metal material.

In its simplest form, the present disclosure pertains to a multi-layer metal material having engineered anisotropy within i) each layer, ii) within combinations of layers or groupings of layers, and/or iii) within the bulk material. The present disclosure also pertains to a process for making the multi-layer metal material having engineered anisotropy within each layer, within combinations of layers or layer groupings, and/or within the bulk material. The engineered anisotropy may be the result of differences in crystalline grain size, crystal grain shape, crystal grain density, crystal grain chemical composition, or crystal grain aspect radio, each of which are controlled or influenced by adjusting or controlling one or more of the following vacuum deposition process parameters: the inert gas employed, e.g., Ar, Kr, Ne, Xe, or Rn, the plasma power, the substrate bias, applied amperage or power, the gas flow rate, the gas flow entry positions, the process pressure, the cooling medium, the cooling time, and/or the deposition time. Each of the foregoing process variables may be ramped up or down during deposition of an individual layer or groups of layers to achieve a gradient of material, mechanical, or chemical properties within an individual layer, groupings of layers or across several layers.

In accordance with the present invention, the resulting PVD deposited metal tubing is characterized by being transversely isotropic and radially anisotropic. After release from its support substrate, the inventive PVD deposited tubing exhibits an opposing radial force to greater advantage, as when compared to drawn tubing, due to the symmetrical radial orientation of its crystal structure. Upon lateral compression of the inventive PVD deposited tubing exhibits elastic deformation that disperses the intergranular load to a larger number of crystals and prevents the catastrophic longitudinal fracture to which drawn tubing is highly prone.

In accordance with the present invention, there is provided a film structure and a method of making film structures comprised of at least one of a plurality of layers of metals and a bond layer at the interface region between adjacent layers of material. A single layer material may be deposited onto a substrate with bond layer at the interface region between the single layer material and the substrate. The resulting film structure exhibits mechanical properties that are superior to those of a non-layered film structure of substantially equal thickness as the multilayer film structure.

It is an object of the present disclosure to provide a metal material having at least two layers of metal material and an interface between each of the at least two layers of metal material, at least one of the two layers of metal material is characterized by a crystalline grain structure having elongate crystals oriented substantially orthogonal to the interface throughout a thickness of each of the at least two layers of metal material.

It is a further objective of the present disclosure that the metal material of at least one layer of the multi-layer material is selected from the group consisting of titanium, vanadium, aluminum, nickel, tantalum, zirconium, chromium, silver, gold, silicon, magnesium, niobium, scandium, platinum, cobalt, palladium, manganese, molybdenum, hafnium, tungsten, rhenium, iridium, bismuth, iron, and alloys thereof, zirconium-titanium-tantalum alloys, nitinol, and stainless steel.

It is a still further object of the present disclosure that the interface or bond layer between adjacent metal layers is characterized by a local concentration of grain boundaries that is higher than a local concentration of grain boundaries within each of the at least two layers of metal material. Further that the interface region or bond layer may, optionally, have a microroughness to facilitate bonding two layers of material.

It is yet another object of the present disclosure that the multi-layer material be a tube wherein the at least two layers of metal material and the interface are concentric relative to each other, and wherein the crystalline grain structure is radially oriented within at least one of the two layers of metal material.

It is still a further object of the present disclosure to provide a deice having a selfsupporting monolithic structure having a plurality of layers of at least one metal or pseudo-metallic material and an interface region defined at a boundary between adjacent pairs of plurality of layers, each of the plurality of layers having a crystal grain structure in which the crystal grains are oriented orthogonal to the plane of the interface region, and the interface region has a local concentration of grain boundaries that is higher than a local concentration of grain boundaries within the bulk of the metal or pseudometallic materials of the plurality of layers.

It is yet a further object of the present disclosure that the multi-layer material be characterized by having at least a majority of the elongate columnar crystals have a length that is at least 80% of the thickness of the layer in which the elongate columnar crystals reside.

It is yet still another object of the present disclosure that the multi-layer material be characterized by having inclusions present at less than or equal to 1% of the total area of the multi-layer material.

It is still another object of the present disclosure that the thickness of each layer delimits the length of the elongate columnar crystals. The layer thicknesses may be equal or unequal throughout the total thickness of the metallic or pseudometallic material. Similarly, there may be a gradient of thicknesses throughout a portion of or the entire thicknesses of the metallic or pseudometallic material. Controlling the layer thickness allows for manipulation of the grain aspect ratio and the number of grains across a feature of the finished article.

It is yet another object of the disclosure to provide the multi-layer material in which the average crystal grain size of the elongate crystal grains is about 2.5 micrometers in at least one of the layers of metal or pseudometal.

It is still another object of the disclosure to provide at least one bond layer or interface region having relatively lower shear stress properties than other layers of the bond layers. In other words, at least one of the bond layers or interface regions in the multi-layer material has shear stress properties that are greater than or less than other bond layers in the multi-layer material.

It is a further object of the disclosure to provide the multi-layer material in which at least one layer has a density of elongate crystal columnar grains less than or greater than one or more other layers of the multi-layer metal or pseudometal material.

It is a still further object of the disclosure to provide a multi-layer material in which at least one layer is made of a first metal or pseudometal and at least one layer is made of a different metal or pseudometal.

Another object of the disclosure is to provide at least one layer of the multi-layer metal or pseudometal being selected from the group of binary, ternary, or quaternary nickel-titanium alloys.

A further object of the disclosure is to provide a multi-layer material in which at least two of the layers form a bimetal.

Another further object of the disclosure is to provide a multi-layer material in which at least one layer is selected to have at least one different mechanical, electrical, chemical, or physical property.

Yet a further object of the disclosure is to provide a multi-layer material which is superelastic and exhibits a tensile stress plateau between about 550 MPa and about 800 MPa at between about 1.7% to about 5% tensile stress.

A still further object of the disclosure is to provide a superelastic multi-layer material that exhibits a recovery energy between about 200 MPa and about 800 MPa.

Another object of the present disclosure is to provide a method of making a multi-layered metal material, comprising the steps of: sputter depositing a first layer of a crystalline metal material having a crystal grain structure throughout the bulk of the metal material in which crystal grains are orthogonally oriented relative to an outer surface of the first layer; interrupting the sputter deposition of the first layer of crystalline metal material; and sputter depositing a second layer of crystalline metal material having a crystal grain structure throughout the bulk of the metal material in which crystal grains are orthogonally oriented relative to an interface bond region between the first layer of metal material and the second layer of metal material.

Yet another object of the present disclosure is to provide a method in which the interrupting step includes, individually or in combination, the step of lowering an applied power, lowering a vacuum pressure within a sputter deposition chamber, lowering a plasma pressure within the sputter deposition chamber, changing an applied electrical bias, and/or changing a temperature within the sputter deposition chamber.

A still further object of the present disclosure is to provide an interface region or bond layer that is oriented substantially parallel to the neutral axis of the multi-layer material.

Yet a further object of the present disclosure is to provide a multi-layer material having grain structures in at least one layer being different than other layers of the multi-layer material.

A still further object of the present disclosure is to provide a multi-layer material having a greater number of layers in regions of the material subject to highest fatigue strain.

Yet another object of the present disclosure is to provide a multi-layer material in which at least some of the layers have a relatively lower crystalline grain density that is less than other layers in the multi-layer material. The layers having relatively lower crystalline grain density may, optionally, be positioned in relatively higher shear stress regions of the multi-layer material.

Another object of the present disclosure includes a step of faux etching a first deposited layer prior to depositing the second layer to enhance the bond layer bond strength between two adjacent layers.

Still a further object of the present disclosure is to control at least one sputter deposition process parameter selected from the group of inert gas pressure, substrate bias, plasma power and chamber temperature, and forming a grouping of at least eight continuous elongate crystalline grains across each dimension of the first layer or the second layer. The grouping of eight elongate crystalline grains act to distribute stress and strain to the multi-layer material across bond layers between adjacent layers of the multi-layer material.

BRIEF DESCRIPTION OF THE FIGURES

FIG. 2A is a scanning electron micrograph at 2000× magnification showing an outer surface of the multi-layer nickel-titanium alloy material in accordance with the present invention showing inclusions and a 20.0 μm scale for reference purposes.

FIG. 2B is a scanning electron micrograph of an outer surface of a wrought nickeltitanium material showing inclusions and a 20.0 μm scale for reference purposes.

FIG. 3A is a graph of the grain size distribution of the multi-layer nickel-titanium alloy material in accordance with the present invention.

FIG. 3B is a graph showing inclusion size distribution in the inventive multi-layer engineered material with data derived from backscattered scanning electron microscopy image analysis.

FIG. 5 is a scanning electron micrograph composite showing a boundary between adjacent layers of the multi-layer engineered material in accordance with the present invention.

FIG. 6A is a scanning electron micrograph showing portions of three layers and the crystal structure of each layer of the inventive multi-layer engineered material; a 10 μm scale is provided for reference purposes.

FIG. 6B is an enlarged section of FIG. 6A showing inclusions along the intragranular boundaries between adjacent crystals of the inventive multi-layer engineered material; a 2 μm scale is provided for reference purposes.

DETAILED DESCRIPTION OF THE PREFERRED EMBODIMENTS

Figure 1:
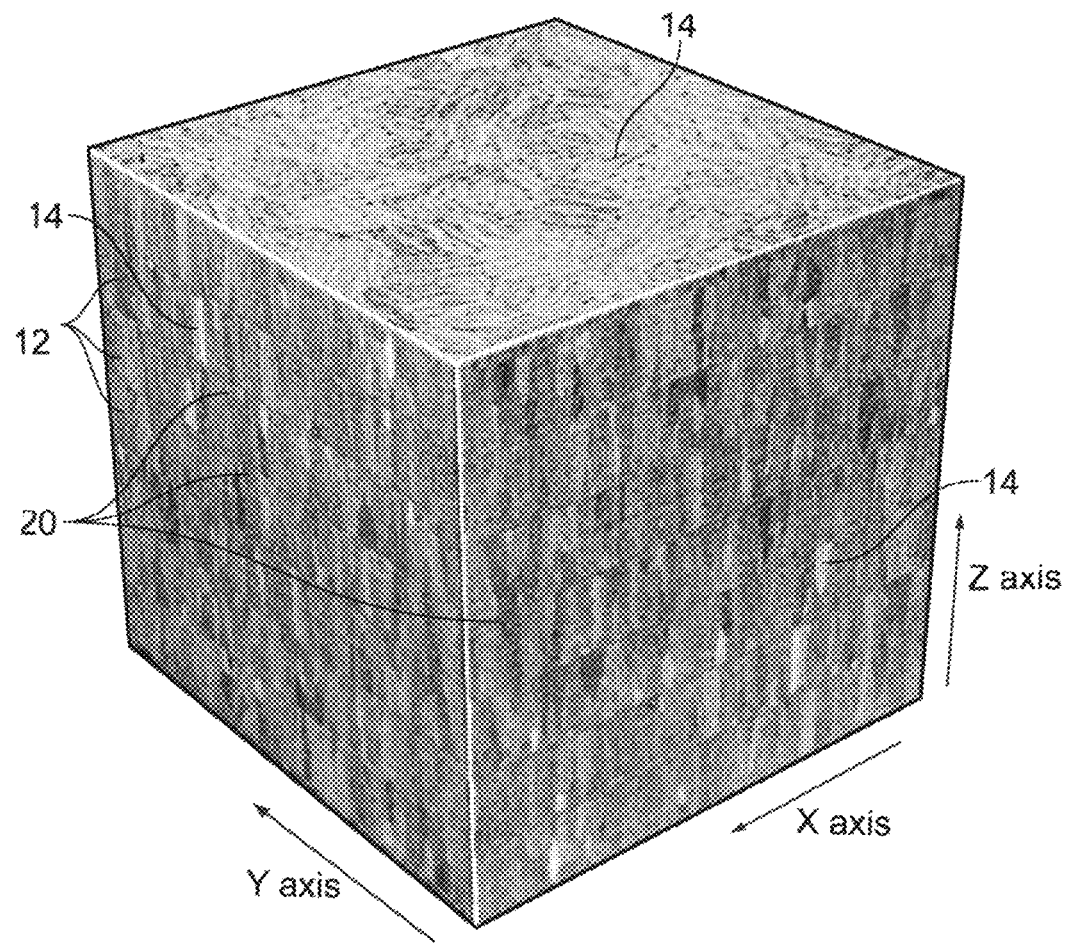
FIG. 1 is a perspective view of a multi-layer material in accordance with the present invention.

For purposes of clarity, the following terms used in this patent application will have the following meanings:

The terminology used herein is for the purpose of describing example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the order discussed or illustrated, unless specifically identified as an order of performance. It is also to be understood that additional or alternative steps may be employed.

When an element or layer is referred to as being "on," "engaged," "connected," or "coupled" to or with another element, it may be directly on, engaged, connected or coupled to the other element or layer, or intervening elements or layers may be present. In contrast, when an element is referred to as being "directly on," "directly engaged to,"

"directly connected to," or "directly coupled to" or with another element or layer, there may be no intervening elements or layers present Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath." "below," "lower," "above," "upper," and the like, may be used herein for ease of description to describe one element or feature's relationship to another element(s) or feature(s) as illustrated in the figures Spatially relative terms may be intended to encompass different orientations of the device in use or operation in addition to the orientation depicted in the figures. For example, if the device in the figures is turned over, elements described as "below", or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

"Substantially" is intended to mean a quantity, property, or value that is present to a great or significant extent and less than, more than or equal to total. For example, "substantially vertical" may be less than, greater than, or equal to completely vertical.

"About" is intended to mean a quantity, property, or value that is present at ±10%. Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. In addition, disclosure of ranges includes disclosure of all values and further divided ranges within the entire range, including endpoints given for the ranges.

Recitation of ranges of values herein are merely intended to serve as a shorthand method of referring individually to each separate value falling within the recited range, unless otherwise indicated herein, and each separate value is incorporated into the specification as if it were individually recited herein.

References to "embodiment" or "variant", e.g., "one embodiment," "an embodiment," "example embodiment," "various embodiments," etc., may indicate that the embodiment(s) or variant(s) of the invention so described may include a particular feature, structure, or characteristic, but not every embodiment necessarily includes the particular feature, structure, or characteristic. Further, repeated use of the phrase "in one embodiment," or "in an exemplary embodiment," do not necessarily refer to the same embodiment or variant, although they may.

As used herein the term "method" refers to manners, means, techniques and procedures for accomplishing a given task including, but not limited to, those manners, means, techniques and procedures either known to, or readily developed from known manners, means, techniques and procedures by practitioners of the chemical, pharmacological, biological, biochemical and medical arts. Unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is in no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

The term "material" is intended to refer to elemental metals, alloyed metals or pseudometals.

For purposes of this application, the terms "pseudometal" and "pseudometallic" are intended to mean materials which exhibit material characteristics substantially the same as metals. Examples of pseudometallic materials include, without limitation, composite materials, polymers, and ceramics. Composite materials are composed of a matrix material reinforced with any of a variety of fibers made from ceramics, metals, carbon, or polymers.

As used in this application the term "layer" is intended to mean a substantially uniform material limited by interfaces between it and adjacent other layers, substrate, or environment. The interface region between adjacent layers is an inhomogeneous region in which extensive thermodynamic parameters may change. Different layers are not necessarily characterized by different values of the extensive thermodynamic parameters but at the interface, there is a local change at least in some parameters. For example, the interface between two steel layers that are identical in composition and microstructure may be characterized by a high local concentration of grain boundaries due to an interruption of the film growth process. Thus, the interface between layers is not necessarily different in chemical composition if it is different in structure.

The term "build axis" or "build direction" is intended to refer to the deposition axis in the material. For example, as a material is being deposited onto a substrate, the thickness or Z-axis of the material being deposited will increase, this is the build axis of the material.

The terms "circumferential" or "circumferential axis" is intended to refer to the radial direction of a tubular, cylindrical or annular material or to the Y-axis of a polygonal material.

The terms "longitudinal," "longitudinal axis," or "tube axis" are intended to refer to an elongate aspect or axis of a material or to the X-axis of the material.

The term "bulk material" is intended to refer to the entirety of the material between its surfaces.

The term "film" is intended to encompass both thick and thin films and includes material layers, coatings and/or discrete materials regardless of the geometric configuration of the material.

The term "thick film" is intended to mean a film or a layer of a film having a thickness greater than 10 micrometers.

The term "thin film" is intended to mean a film or a layer of a film having a thickness less than or equal to 10 micrometers.

This detailed description of exemplary embodiments makes reference to the accompanying drawings, which show exemplary embodiments by way of illustration. While these exemplary embodiments are described in sufficient detail to enable those skilled in the art to practice the disclosure, it should be understood that other embodiments may be realized and that logical changes and adaptations in design and construction may be made in accordance with this disclosure and the teachings herein without departing from the spirit and scope of the disclosure. Thus, the detailed description herein is presented for purposes of illustration only and not for purposes of limitation.

In accordance with an aspect of the present invention there is provided a vacuum deposited multi-layer material with interfacial bond regions between adjacent materials, in which each layer is characterized by having substantially uniform bulk material properties and crystalline columnar grains with each layer containing a majority of crystalline columnar grains that have a length extending at least a majority of the thickness of each layer. Each individual layer may be substantially uniform in crystal grain morphology, thickness, and material. Each individual layer may have a substantially uniform gradient of crystal grain morphology such that the crystal grains exhibit gradient of widths throughout a thickness of each layer. Similarly, the plurality of layers may have substantial uniformity in each individual layer on a layer-by-layer basis, or the plurality of layers may have differing thicknesses, grain morphologies, or chemical composition on a layer-by-layer basis and the layers may be arranged to achieve the desired overall film properties in the bulk film. For example, the layers may be arranged to distribute the shear stresses in a defined manner across the bulk film based upon the intended use of the material and the bending moment that the material will encounter during its intended use, Most industrial materials, including, without limitation, biomaterials used to make medical devices such as intraluminal stents, orthopedic implants, cardiac valves, capsulotomy devices, and the like; aerospace materials, such as those for flight control surfaces, including, without limitations, wings, rudders, ailerons, elevators, spoilers, flaps, slats, stabilizers, winglets, air brakes, or helicopter rotor blades; or automotive components, are typically made, in whole or in part, from wrought processed metals. As discussed above, wrought processed metals are characterized by crystal structures that typically have disordered large crystal grain structures and high levels of inter- or intragranular inclusions that weaken the overall structure of the formed bulk material and necessitate adjunctive supporting materials or structures.

The present disclosure may refer to biomaterials and medical devices for exemplary and non-limiting purposes only. Examples of such biomaterials and medical devices include, for example, tubular or annular materials employed as precursor materials for fabrication of medical devices such as intraluminal stents, cardiac valves or capsulotomy rings. It is intended that reference to biomaterials and medical devices is for illustrative purposes only and is not intended nor should be construed as limiting the scope of the materials disclosed herein or of their use or application to the resulting devices or applications in manufacturing contexts. It is expressly contemplated and intended that the materials referenced in the disclosure are not limited by the intended use or application of the material. Indeed, the material referenced in the disclosure are intended to be capable of having different mechanical, chemical and/or electrical properties engineered to suit many different intended end-uses for the material. Without limiting the scope of application of the present invention, the material of the present disclosure may be employed in a wide variety of applications, including, without limitation medical devices, electronic components, aerospace surfaces, mechanical devices, electromechanical devices, MEMs devices, etc. Thus, the engineered materials of the present disclosure will have application in both medical and non-medical applications.

The current invention entails creating anisotropic metal materials by PVD processes and the resulting anisotropic metal materials. While the inventive materials have uses as biocompatible materials for fabrication of medical devices, including, without limitation, implantable and indwelling medical devices, the present invention is not intended to be limited to biocompatible materials. According to a one aspect of the invention, the invention pertains to precursor materials, including, without limitation i. biomaterials suitable for manufacture of grafts, stents, stent-grafts, other intraluminal devices, valve frames, capsulotomy rings, or other annular or tubular structures fabricated of biomaterials; ii. aerospace materials suitable for manufacture of flight control surfaces, including, without limitations, wings, rudders, ailerons, elevators, spoilers, flaps, slats, stabilizers, winglets, air brakes, or helicopter rotor blades; iii. automotive components, that are typically made, in whole or in part, from wrought processed metals; iv. electronic component materials suitable for manufacture of, for example, fuses, capacitors, resistors, sensors, electrodes, actuators, antennae, or the like.

Tubular or annular materials of the present disclosure are formed by physical vapor deposition of precursor metals. The metals may be substantially pure metals or alloys, and may be plastically deformable, elastically deformable, or shape memory alloys. The materials of the present disclosure preferably have multi-layer structures, with each layer corresponding to a single layer of crystal grains and interfacial regions between adjacent layers where the crystal structure of each layer interfaces and bonds with the crystal structure of an adjacent layer in a defined interfacial region that separates adjacent layers. Inter- and intragranular inclusions are controlled such that both the size and frequency of the inclusions are minimized and are generally far smaller and evenly disbursed as a result of the PVD processing of the material. PVD deposited binary and ternary nickel-titanium alloys exhibited a mean inclusion size being less than about 45 nanometers and an area fraction of the inclusions relative to the material area is less than or equal to about 0.01% according to one embodiment of the invention. In accordance with another embodiment of the invention, the mean inclusion size is about 35 nanometers with an area fraction of the inclusions relative to the material area is less than about 0.15%. Thus, the mean inclusion size in the inventive material is between about 35 nanometers to about 45 nanometers with an average area fraction of the inclusions being between about 0.01% to about 0.15% of the total material area. Maximum inclusion size was less than about 100 nanometers.

The multi-layer metal material is composed of plural layers characterized by a single crystal length depth, an interfacial region between adjacent layers in which the crystal grain structures between adjacent layers are discontinuous forming a highly discernable interlayer visible under scanning electron microscopy.

Generally, the process of making the multi-layer materials with engineered anisotropy includes the steps of providing a substrate having a desired geometry, vacuum depositing a first layer of material on the substrate, interrupting the vacuum deposition by controlling one or more process parameters to create conditions that disrupt the deposition process; vacuum depositing a second layer of material onto the first layer of material and, optionally, either removing the layered material from the substrate or continuing with further successive interruption steps. The last step is necessary in the case of making sheets, foils, or tubes but would be omitted in the case of making wires. In this latter case, the substrate itself is a thin wire that becomes part of the final product. In more complex cases, the number of layers is more than two. There is no limitation regarding the number of layers or the thickness of each layer. Typically, however, it is preferable to have approximately between about 8 to about 10 grains per feature in the layered material in order to tailor the material to a desired application.

Interlayer adhesion typically is achieved by providing a relatively broad interface region rather than a relatively narrow well-defined interface region. The width of the interface region may be defined as the range within which extensive thermodynamic parameters change from one layer to the next adjacent layer of material. Interface region micro- or nano-roughness of the adjacent grain structures will also be implicated in the interface region interlayer adhesion coefficient and will affect the stress-strain profile at each interface region. Increased micro- or nano-roughness at the interface region will increase the interference between grain structures at the adjacent layers and, therefore increase the stress-strain behavior of the interface region. Conversely, reduced micro- or nano-roughness will have the opposite effect. Simulated plasma etch conditions may be employed to enhance the bond strength of the interface region between adjacent layers of material.

In the present disclosure, the materials exhibit a relatively narrow well-defined interface region. By relatively narrow, it is intended that the interface region have a Z-axis thickness averaging less than about 300 nanometers, and is preferably within the range of greater than 0 to less than or equal to about 500 nanometers. This relatively narrow well-defined interface region is achieved by interrupting the deposition, such as by, individually or in combination, lowering the applied power, lowering the vacuum pressure within a sputter deposition chamber, lowering a plasma pressure within the sputter deposition chamber, interrupting the plasma, changing an applied electrical bias, and/or changing a temperature within the sputter deposition chamber, for a period of time sufficient to discontinue deposition of the target species, then resuming the deposition, such as by restoring the changed process parameter, e.g., restoring the plasma, to deposit a subsequent layer. Interrupting the deposition serves to discontinue deposition of the target species onto the substrate by removing the energy required to ping target atoms from the target and/or travel to the substrate to form the deposited material.

Exemplary engineered anisotropic materials 10 exhibit controlled sizes of columnar crystalline grains 14 with a mean grain length of about 2.5 micrometers, within a range between about 1 to about 6 micrometers, with at least some of the columnar crystalline grains extending the at least substantially the entire build direction of each single layer. Typically, at least a majority of the columnar crystalline grains have a length that is at least about 80% the thickness of the layer in which the columnar crystalline grains reside. Of course, both the length, width and morphology of the columnar crystalline grains may be controlled by adjusting PVD process parameters during deposition of an individual layer of the material, such as changing the working gas, changing the deposition pressure, increasing or decreasing the power to the plasma, increasing or decreasing the chamber temperature, increasing or decreasing the applied bias, or the like.

Figure 7:
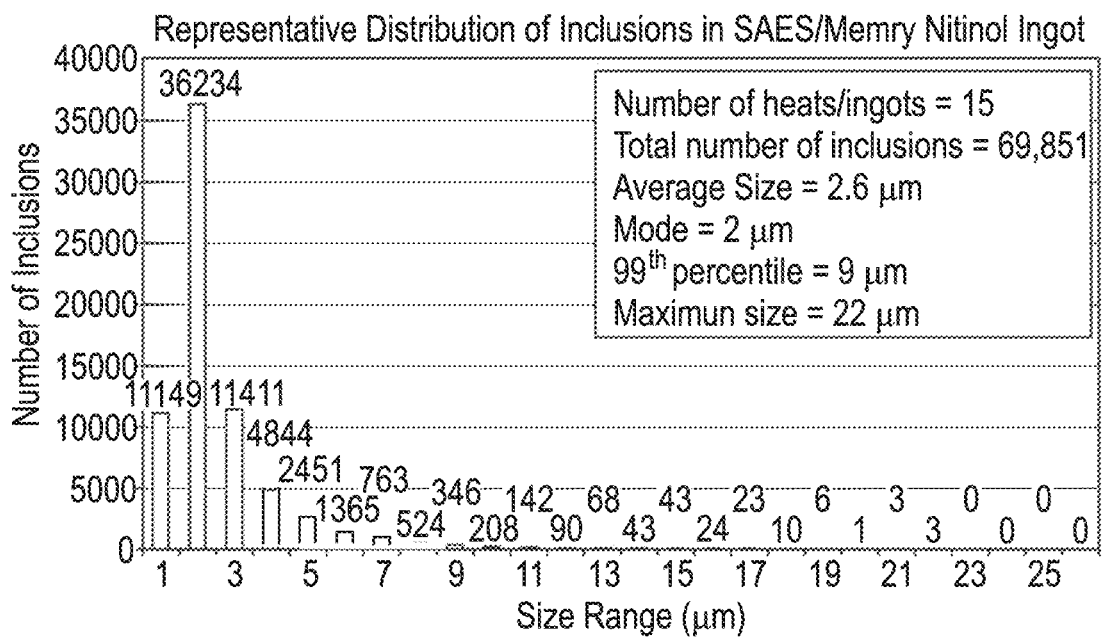
FIG. 7 is a graph illustrating of the number and size of inclusions in a commercially available nickel-titanium wrought ingot.

FIG. 3A is a graph illustrating the grain size distribution against the probability density of the respective grain size population. The inventive materials also exhibit inclusions having a mean size of about 45 nanometers and a total inclusion area fraction of about 0.01% of the entire bulk material area as shown in FIG. 3B. FIG. 7 is a graph illustrating inclusion size distribution in the disclosed material as a function of probability density of the respective inclusion size population. In contrast, as shown in FIG. 7, conventional NiTi wrought materials exhibit a broad range of inclusion size distribution with an average inclusion size of 2.6 micrometers or 2600 nanometers, a $99^{th}$ percentile inclusion size of 9 micrometers, and a maximum inclusion size of 22 micrometers.

In contrast, the ASTM F2063 standard for average inclusion size in NiTi alloys is 39 micrometers, with an inclusion area fraction of 2.8%. Memry Corporation's Nitinol REDOX (Bethel, CT), exhibits an average inclusion size per ASTM F2063 of 20 micrometers and an average inclusion area fraction of 1.2% (See, e.g., www.memry.com/mill-products). Thus, the present materials exhibit significantly reduced average inclusion size (45 nanometers vs. 20 micrometers and average inclusion area fraction (0.01% vs 1.2%), representing multiple magnitudes of order differences in both average inclusion size and average inclusion area fraction between the present vacuum deposited materials and wrought produced materials.

Multi-layer materials 10 of the present invention have additional advantages when the mechanical and/or chemical properties of the one or more layers are chosen in advance of making the material. For example, a radiopaque material, such as Ta, may form one layer of a material structure while other layers are chosen to provide the material with desired mechanical and other properties, such as binary, ternary, or quaternary shape memory alloy. Further, one or more layers of a material structure may have a build or Z-axis thickness that is greater than or less than either the adjacent layers or other layers of the material. Still as another further example, one or more layers may be binary metal alloy, while one or more other layers may be ternary or quaternary metal alloy. As yet another further example, one or more layers may have higher or lower crystal grain densities than other layers in the bulk material. As still yet another further example, one or more layers may be characterized by having crystal grains with tapered walls along the longitudinal axis of the crystal grains. Yet another example of the inventive material is to fabricate one or more of the layers as failure layers, such that any fatigue or other failures of an individual layer does not propagate to the remainder of the layers or cause a catastrophic failure in the bulk material. An advantage of providing one or more failure layers is that a device may be designed in which the failure layer(s) act as a fuse to change the electrical conductivity or resistivity of the device material and allow for detection of the layer or layers having failed or predict a pending failure of the device. Alternatively, the material may act as a mechanical fuse where a partial failure of one or more layers prevents a complete failure of the material itself.

As illustrated by the foregoing, a large number of permutations in the number of layers, layer thicknesses, crystal grain morphology, crystal grain chemistry, crystal grain size, interface layer morphology, and the like are all capable of being controlled or engineered based upon the desired mechanical, chemical and/or electrical properties desired for the material, each of which may be based in whole or in part upon the intended use of the material or the intended function of the device that the material is employed to fabricate.

For the materials disclosed herein, bending stress, $\sigma_{bend}$, may be calculated by the formula:

$$\sigma bend = \frac{My}{I}$$

Where M is the internal bending moment about a material section's neutral axis, y is the perpendicular distance from the neutral axis to a point on the material's section, and I is the moment of inertia of the section area about the neutral axis. Alternatively, the maximum bending stress mx may be calculated according to the formula:

$$\sigma max = \frac{Mc}{I}$$

Where M is the internal bending moment about a materials section's neutral axis, c is the perpendicular distance from the neutral axis to the outer aspect of the material's section, and I is the moment of inertia of the section area about the neutral axis. Both bending stress and bending maximum are expressed in units of Mega Pascals (MPa) or Pascals (Pa). For a given material, particularly with a beam-like material, for example, those found in intraluminal stents, or sections of annular rings, for example, those found in a cardiac valve support rings or capsulotomy rings, the vector of the bending moment will be different based upon the specific use and environmental factors that the specific device is intended for use in.

Layered Arrangement and Composite Material Behavior

The length of the crystalline grains is controlled by process manipulation. Either prior or during initiating an adjacent layer deposition, a circumferential bond layer is created forming a defined transition. The structure thus created can be compared to other ply materials as plywood and bonded packaging paper with remarkable improvement in mechanical anisotropic properties. Columnar crystalline grain growth in the build direction, i.e., the Z-axis thickness of the material, is highly flexible and may be controlled by manipulating different process parameters to define crystalline grain length, grain morphology, grain density, layer thickness, and the interfacial bond regions between adjacent layers, synonymously referred to as bond layers. The columnar crystalline grains have their longitudinal axis in the build direction, which is also orthogonal to the axis of the bond layer. In this manner, the metallic or pseudometallic material in each layer and the bond layers behave as a composite material with the advantageous properties of 1) dispersion of localized lateral compression or tension forces; 2) resistance or preservation from fracture propagation from one layer to the next: 3) increased mechanical properties relative to homogenous bulk materials; 4) expanded device design options based upon the physical, mechanical and chemical properties of the material.

Optionally, at least one bond layer or interface region may be formed to have relatively lower shear stress properties than other bond layers within the thickness of the material. In other words, at least one of the bond layers or interface regions in the multi-layer material has shear stress properties that are greater than or less than other bond layers in the multi-layer material. In this manner, the bond layer with shear stress properties that are lower than other the bond layers will act as a primary failure point and serve as a mechanical fuse to prevent a larger or total failure of the multi-layer material itself because the failure will not propagate through the thickness of the multi-layer material.

Dispersion of Localized Lateral Compression

The concentration of bending deformation forces is dissipated over a larger area by the multi-layer structure of the material 10. This operates to great advantage in tubular materials, such as intravascular stent platforms, where concentrated lateral forces are exerted on the stent structure by radial collapse, kinking due to extreme bending, or repetitive radial or circumferential pressure, such as that experience as a result of inherent blood pressure changes within the vasculature. Stent platforms, in particular, are highly susceptible to repetitive stress fractures at hinge points within the stent design. This susceptibility is mitigated with the present material due to the orthogonal dispersion of compression and tension forces relative to the layers in the material as a result of applied bending moments on the stent material.

Preservation from Fracture Propagation

Just like in plywood, where the extremely anisotropic wood layers are likely to easily fracture if bent along the grain, fracture propagation is prevented by intervening wood layers and bonding glue. Similarly, in the present material, if grain separation occurs, it will be limited to that layer where the acting force is absorbed as shear stress on the bond layer.

Increased Mechanical Performance of the Composite Vs Homogeneous Material:

By dispersing an acting force as shear stress on the bond layers between adjacent crystalline grain layers, the present material behaves markedly different than a homogenous bulk material of similar geometries and dimension. Whereas a force acting on a homogenous material is dispersed as compression and tension forces throughout the material, the multi-layered material 10 of the present disclosure localizes the acting force as shear stress at the individual bond layers and distributes that force across all layers of the material. A failure will, therefore, be localized to one or more layers and will not propagate across the grain structure of the entire bulk material. This structure allows for fabrication of smaller, lower profile devices having the same or greater stress-strain profiles as devices of greater dimension or greater profile.

Implications of Composite Metal Constructs on Design of New Devices:

The foregoing advantages extend to both austenitic and martensitic metals, such as those used in a wide variety of medical applications, including, for example, self-expanding and balloon-expandable peripheral and coronary stents, stent frames, cardiac valve frames, capsulotomy rings, and other tubular, annular, or net-shaped medical devices. Those skilled in the materials science arts will appreciate and understand that the disclosed multi-layer material has broad application as an enabling technology across may areas of application other than medical devices, including, without limitation, aerospace, automotive, electronics, electromechanical applications, etc., where it exhibits mechanical, physical and electrical properties superior to current metallic stock materials.

100-micron thick films of binary nickel-titanium material and ternary nickel-titaniumcobalt material, each having ten layers with intermediate bond layers, were within about four hours in a cylindrical magnetron deposition chamber. It will be understood that at least one layer of the multi-layer material may be made of other metallic or pseudometallic materials, such as those selected from the group consisting of at least one layer of the multi-layer material is selected from the group consisting of titanium, vanadium, aluminum, nickel, tantalum, zirconium, chromium, silver, gold, silicon, magnesium, niobium, scandium, platinum, cobalt, palladium, manganese, molybdenum, hafnium, tungsten, rhenium, iridium, bismuth, iron, and alloys thereof, for example, nickel-titanium-cobalt, nickel-titanium-chromium, zirconiumtitanium-tantalum alloys, nitinol, or stainless steel.

Correlations between sputter deposition process parameters have been identified that result in the ability to control crystal growth, individual layer thickness, crystal density, layer density, inclusion density, inclusion size, material thickness, layer-to-layer crystal uniformity, interfacial region characteristics, layer-to-layer adhesion at the interfacial region, and the overall fatigue resistance, stress propagation characteristics, and corrosion resistance. Because each layer of the multi-layer material is separately deposited, grain growth, crystalline grain morphology, and crystal grain density may be controlled within an individual layer, on a layerby-layer basis, between layers, and/or throughout the thickness of the multi-layer material itself. For example, the density of crystalline columnar grains in one layer may be less than or greater than one or more other layers of the multi-layer metallic or pseudometallic material. At least some of the layers may be deposited with relatively lower crystalline grain density than other layers in the multi-layer material, with the layers of relatively lower crystalline grain density optionally positioned in areas of the multi-layer material that will be subjected to relatively higher shear stresses.

Similarly, each layer may be composed of different metallic or pseudometallic species, e.g., one layer may be binary nickel titanium, another layer may be an elemental metal such as tantalum, another layer may be ternary nickel-titanium and another layer may be a quaternary nickel-titanium alloy species. Similarly, adjacent layers of metal material may form a bimetal.

During deposition, the chamber pressure, the deposition pressure and the partial pressure of the process gases are controlled to optimize deposition of the desired species onto the substrate. As is known in the microelectronic fabrication, nano-fabrication and vacuum coating arts, both the reactive and non-reactive gases are controlled and the inert or non-reactive gaseous species introduced into the deposition chamber are typically argon and nitrogen. The substrate may be either stationary or moveable; either rotated about its longitudinal axis, moved in an X-Y plane, planetarily or rotationally moved within the deposition chamber to facilitate deposition or patterning of the deposited material onto the substrate. The deposited material may be deposited either as a uniform solid film onto the substrate, or patterned by (a) imparting either a positive or negative pattern onto the substrate, such as by etching or photolithography techniques applied to the substrate surface to create a positive or negative image of the desired pattern or (b) using a mask or set of masks which are either stationary or moveable relative to the substrate to define the pattern applied to the substrate. Patterning may be employed to achieve complex finished geometries of structural members such as stent struts, void regions such as interstitial openings, channels, tunnels, depots, wells, or the like, that may be present in one or more layers or extend between layers of the disclosed material.

After material formation, the resulting material may be removed from the substrate by any of a variety of methods. For example, the substrate may be removed by chemical means, such as etching or dissolution, by ablation, by machining or by ultrasonic energy. Alternatively, a sacrificial layer of a material, such as carbon, aluminum or organic based materials, such as photoresists, may be deposited intermediate the substrate and the stent and the sacrificial layer removed by melting, chemical means, ablation, machining or other suitable means to free the stent from the substrate. Further, the substrate may be coated with a diffusion barrier that permits the deposited material to slide or slip off the substrate.

The present invention, therefore, consists of both a material and a process of making the inventive material. The inventive material is one for which mechanical strength and toughness is important, among other characteristics. In accordance with the best mode presently contemplated for the invention, the inventive material consists of several layers of Nitinol, each of about 10 micrometers thick with no chemical differences between them. The layers are defined by interfaces between them that have an interface microroughness in excess of 2 nanometers rms. The cumulative thickness of the Nitinol material is about 100 micrometers.

The inventive material is preferably made by positioning a cylindrical substrate mandrel along the axis of a cylindrical DC magnetron sputtering device. After the routine preparatory steps of obtaining a vacuum, admitting Argon sputtering gas, and cleaning the surface of the target, material deposition was carried out at a rate of 50 micrometers per hour for 12 minutes to obtain the first 10 micrometer thick layer. During the deposition, a negative bias voltage of 120 V is applied to the mandrel. The material growth exhibited a columnar grain morphology in the deposition direction and a majority of columnar grains in each layer had a length that extended a at least substantial portion of each layer's thickness. After the first layer is deposited, the deposition process is interrupted for a brief period of time (~1 min). This time is sufficient for the formation of an adsorptive layer on the freshly deposited film. When the deposition is resumed, this adsorptive layer gives rise to columnar growth that that is different from the columnar growth of the previous layer only in that the columns are not continuous. The deposition process steps are then repeated until the desired cumulative material thickness is attained. At that point, the deposited material, still on the mandrel, is removed from the vacuum deposition chamber and the deposited material is liberated from the substrate. Additional postdeposition steps of surface finishing, cutting, etc. may be employed.

FIG. 1 is a composite of scanning electron micrographs (SEM) showing a transverse cross-sectional view taken along the radial axis, a transverse cross-sectional view taken along a longitudinal axis, and an end view taken along the Z-axis showing a build direction view of an outer surface of the inventive multi-layered material 10. The build direction or Z-axis, X-axis and Y-axis of the deposited material are denoted by directional arrows. The material 10 consists of a plurality of individual layers 12 that extend in the X-axis and the Y-axis and have a thickness in the Z-axis or build direction. Each of the individual layers 12 is comprises of a plurality of crystalline grains 14, at least some of which extend the entire thickness of an individual layer 12 in the build direction. An interface region or bond layer 16 is present between adjacent layers 12 and serves to join adjacent layers to each other. The individual layers may be made of the same biocompatible material, such as a biocompatible metal, or may be made of discrete biocompatible materials. Each layer 12 is vacuum deposited such that the plurality of crystalline grains 14 are in the crystalline state when deposited. In other words, no layer 12 nor grains 14 are in the amorphous state that require further post-deposition annealing or other treatment to create the crystalline state of the grains 14.

FIG. 2A and FIG. 2B are same magnification SEMS of outer build direction surfaces an inventive vacuum deposited NiTi material 10 in FIG. 2A and of an outer surface of a wrought NiTi material 30 after annealing in FIG. 2B. Each Figure shows the size and distribution of both the grain structures (14, 34) and the inclusions 18, 38). The size and distribution of the crystalline grains 14 and the inclusions 18 in the inventive vacuum deposited NiTi material 10 shown in FIG. 2A exhibits significantly more ordered crystalline grains 14 and significantly fewer and far smaller inclusions 18 that is found with the crystalline grains 34 and inclusions ⅜ in the wrought NiTi material shown in FIG. 2B. The mean inclusion size in an embodiment of the inventive vacuum deposited NiTi material 10 is 35 nanometers, with the inclusions 18 being carbide only. Average crystalline grain 14 size in the vacuum deposited NiTi material is 2.2 micrometers. In contrast, in the wrought NiTi material, the mean inclusion size is 2600 nanometers (2.6 micrometers), with an average grain size between 20 to 40 micrometers and both carbide and oxide inclusions 38.

Figure 4A:
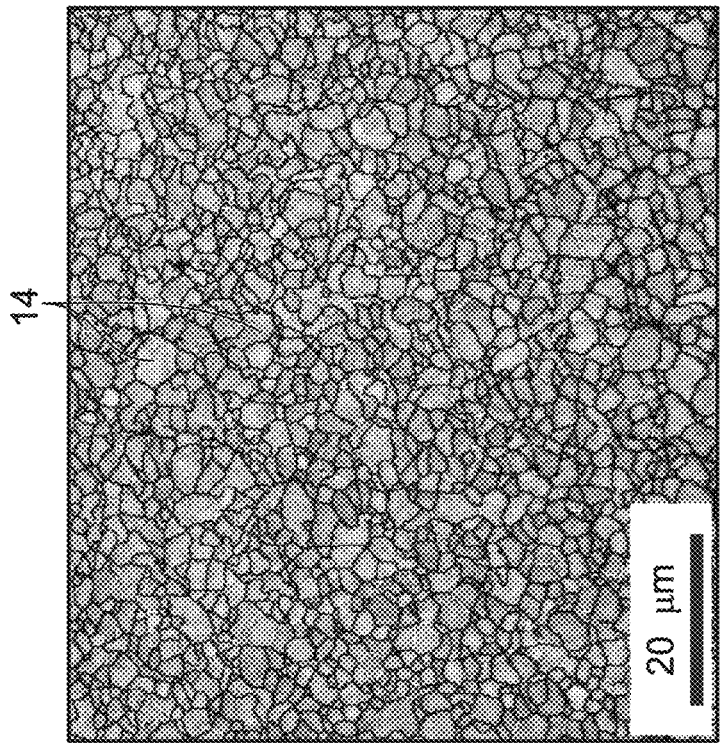
FIG. 4A is a scanning electron micrograph taken transversely along a longitudinal axis of the multi-layer engineered material in accordance with the present invention. A 20.0 μm scale is shown for reference purposes.
Figure 4B:
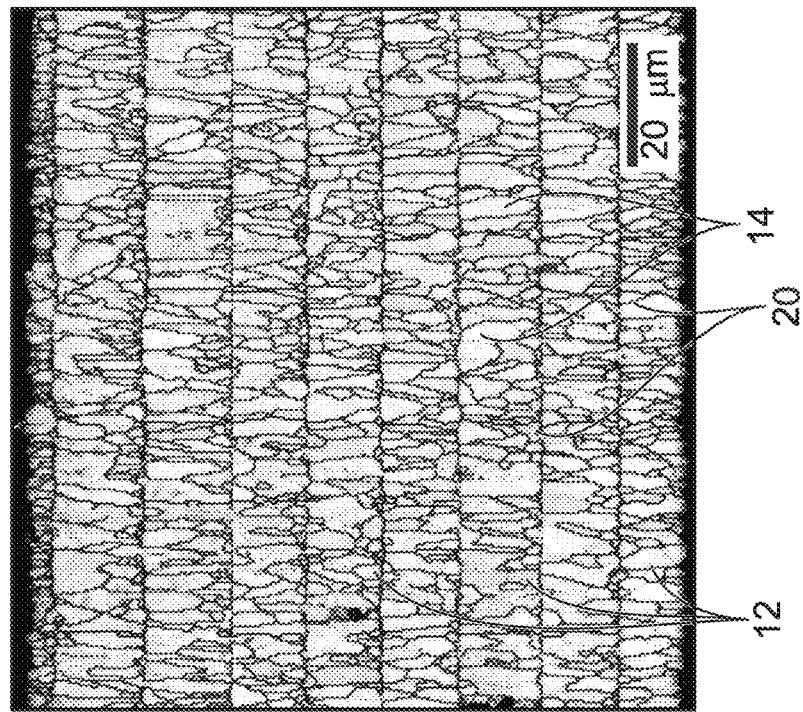
FIG. 4B is a scanning electron micrograph of an outer surface of the multi-layer engineered material taken parallel to the Z-axis of the material in accordance with the present invention.

FIG. 4A is a band contrast SEM of a side view in both the transverse and build directions of the inventive multi-layer material 10, in this case vacuum deposited NiTi, illustrating well defined columnar crystalline grain structures 14 in each layer, clearly demarcated bond layers 20 between adjacent layers 12 of the material 10, and defined intergranular boundaries in each layer 12. A majority of columnar crystalline grains have a length that substantially corresponds to the Z-axis or build direction thickness of each layer 12, i.e., the distance between pairs of bond-layers, such that each layer 12 has substantially a single crystal thickness in the build direction. FIG. 4B is a band contrast SEM showing a top view perpendicular to the build direction of the same inventive vacuum deposited NiTi material 10 and at the same magnification as shown in FIG. 4A. Again, well-defined crystal grain structures 14 are shown as well as well-defined intergranular boundaries between adjacent crystal grain structures in the vacuum deposited NiTi material 10. The bond layers 20 preferably have a thickness between greater than 0 nanometers and less than about 500 nanometers depending upon the ordering of and interfacing between the columnar crystalline grain structures 14 on either side of a bond layer 20.

FIG. 5 is a composite SEM with a 500 nanometer scale for reference showing an interface region 20 between two adjacent layers 12. FIG. 5 shows the crystalline grains 14 on each side of the interface region 20 illustrating the interlocking nature of the intergranular boundaries 22 at the interface region 20. Inclusions 18 appear predominately at the interface region rather than at other intergranular boundaries 22 within the thickness of each individual layer 12.

FIGS. 6A and 6B are each BSC SEM micrographs in the radial and transverse direction showing a layer 12 thickness comprised of crystal grains 14, and showing the interface boundary region 20 between adjacent layers 12. Inclusions 18 are not readily visible at the magnification shown in FIG. 6A, however, a 5× increase in magnification (see the reference scale in each of FIGS. 6A and 6B) of Section A shows small inclusions 18 only at the intergranular boundaries between adjacent crystal grains 14 along the transverse direction of the material 10.

Figure 8:
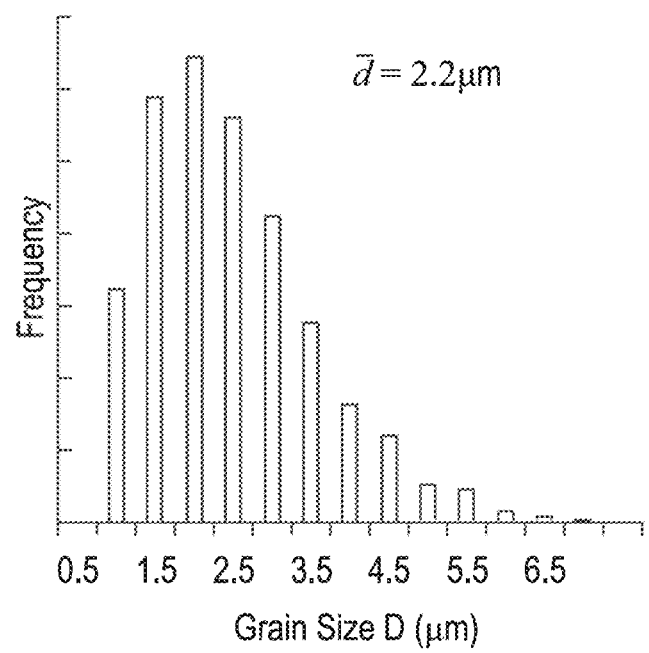
FIG. 8 is a graph illustrating grain size distribution in a 115 micrometer thick film of the inventive multi-layer engineered material.

As noted above, FIG. 7 compares the inclusion size as a function of density probability density within the inventive material 10. In the sample NiTi material, the mean inclusion size was about 45 nanometers and a total inclusion area fraction of about 0.01% of the entire bulk material area of the sample NiTi material. FIG. 8 is a graph of inclusion size as a function of inclusion frequency for a different NiTi material than that shown in FIG. 7. The material 10 in FIG. 8 exhibited a mean inclusion size of 36 nanometers with a maximum inclusion size of 100 nanometers, and an inclusion volume that was less than about 0.15% of the entire bulk material area of the sample NiTi material.

Figure 9A:
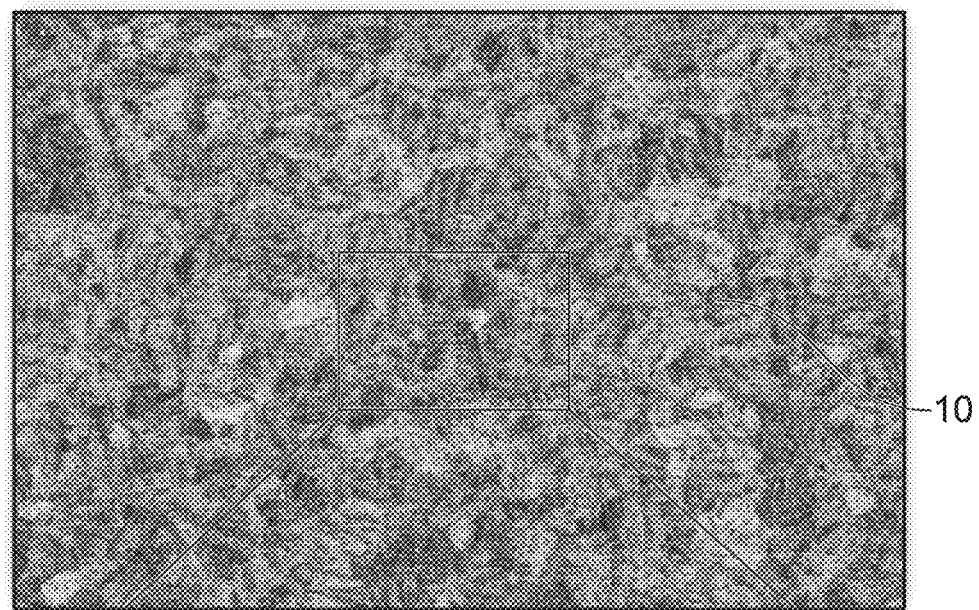
FIG. 9A is a backscattered electron (BSE) micrograph image taken perpendicular to the build direction of an outer surface of the inventive multi-layer engineered material.
Figure 9B:
FIG. 9B is an enlarged section of FIG. 9A showing inclusions along the intragranular boundaries between adjacent crystals of the inventive multi-layer engineered material.
Figure 10:
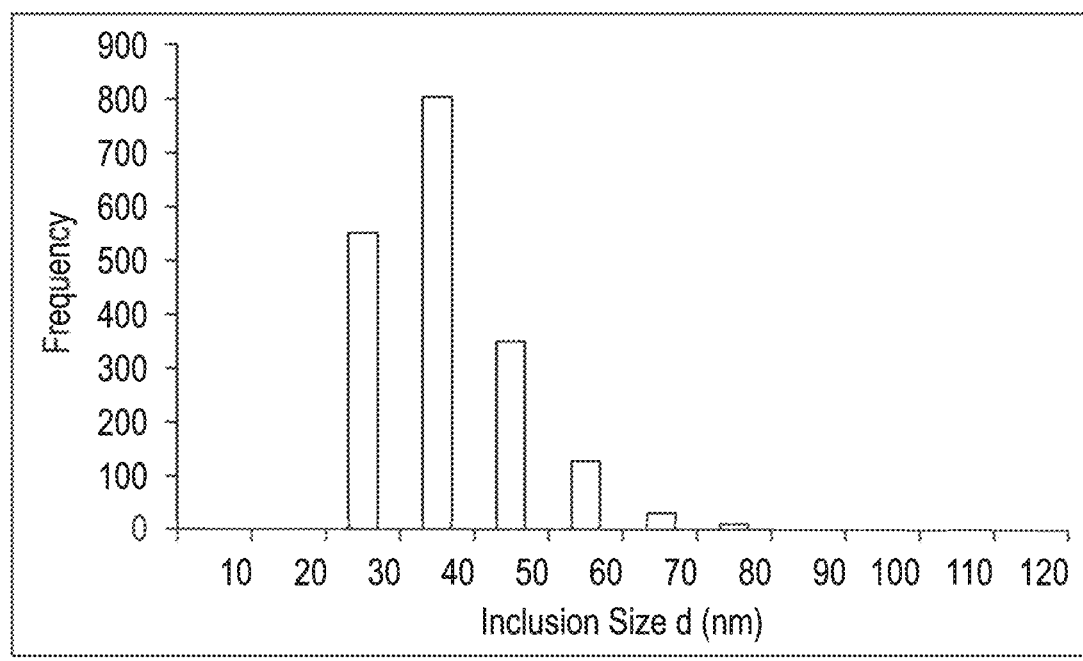
FIG. 10 is a graph illustrating inclusion size and distribution at the outer surface of the inventive multi-layer engineered material.

In characterizing the inclusions in the NiTi material 10 used to generate the data in FIG. 8, backscattered electron detector (BSED) images of that material were taken perpendicular to the build direction of the material and are shown in FIGS. 9A and 9B. Like with the material shown in FIGS. 6A and 6B, inclusions 18 are not readily visible at the magnification shown in FIG. 9A, however, a 5× increase in magnification (see the reference scale in each of FIGS. 9A and 9B) of Section B shows small inclusions 18 predominantly only at the intergranular boundaries between adjacent crystal grains 14 along the surface perpendicular to the build direction of the material 10. FIG. 10 is another graph of the inclusion size and frequency of inclusions of a given size taken from the BSED images in FIGS. 9A and 9B.

Figure 11:
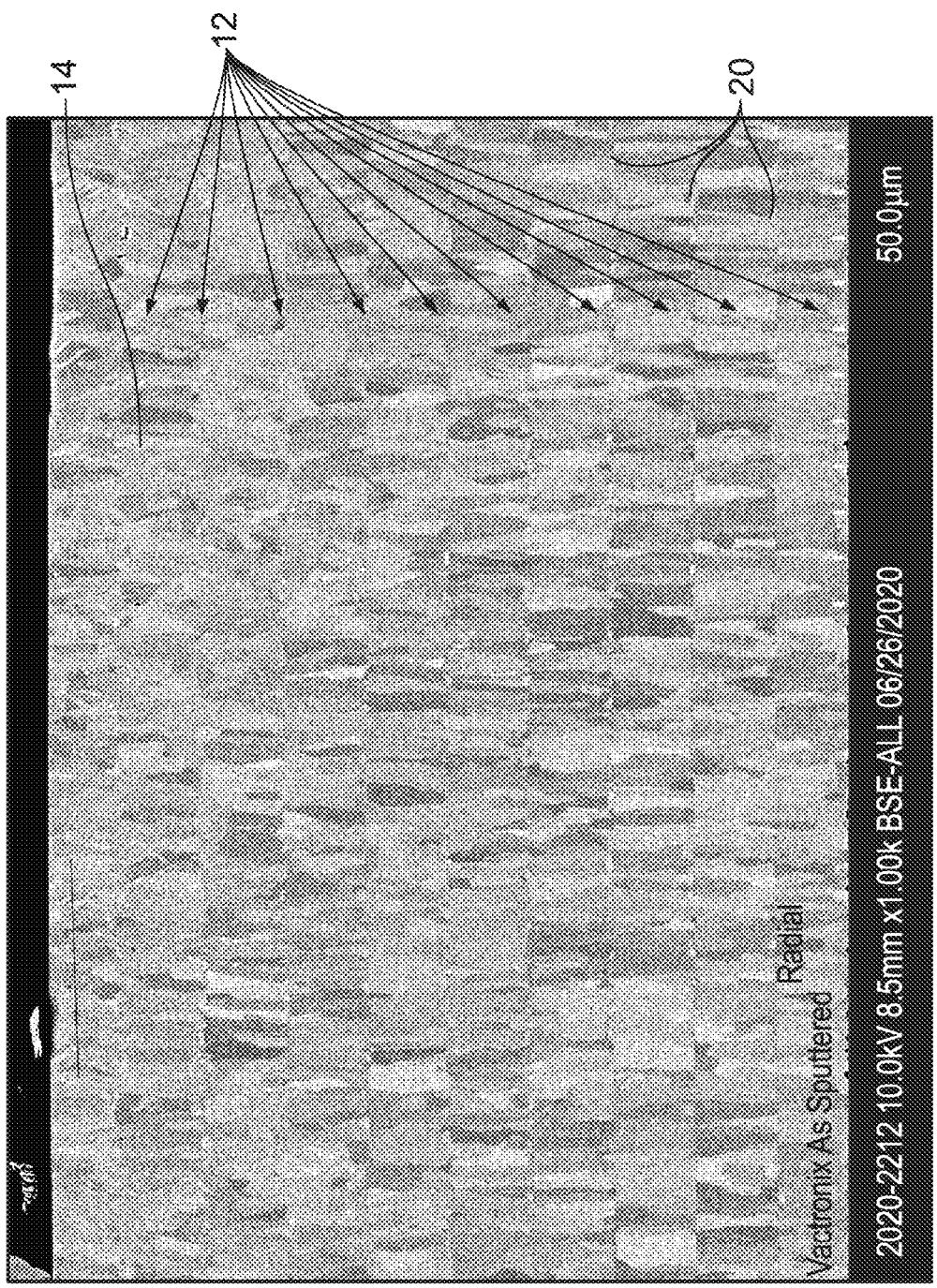
FIG. 11 is a BSE micrograph taken at 1000× magnification of a transverse crosssection of a tubular multi-layer engineered material in accordance with the present invention illustrating ten individual layers and the boundaries between adjacent individual layers; the upper surface is the build direction outer surface and the lower surface is the substrate interface: a 50 μm scale is provided for reference purposes.
Figure 12:
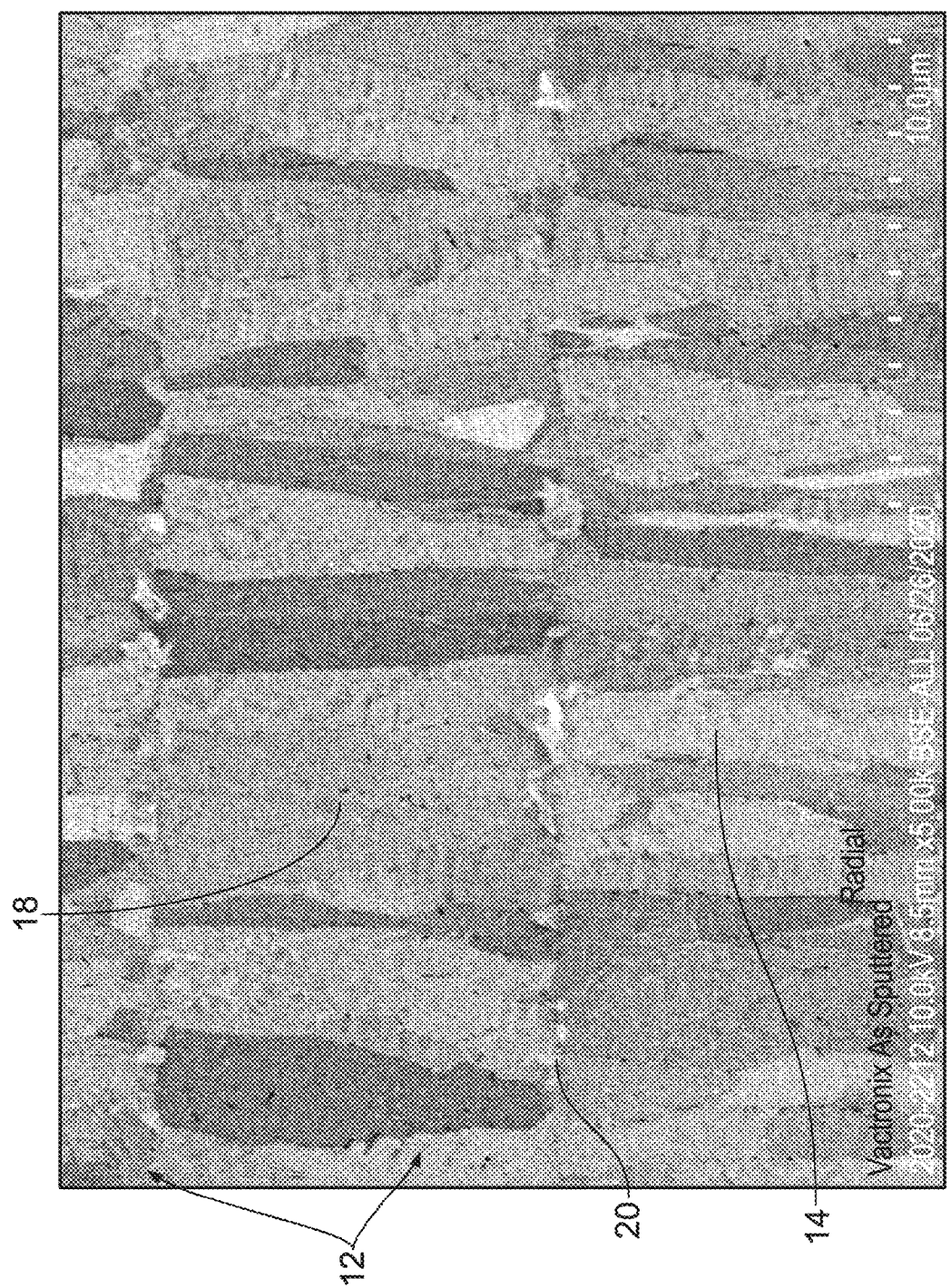
FIG. 12 is an BSE micrograph of FIG. 11 taken at 5000× magnification showing the crystal grain morphology of a portion of one layer and the crystal grain morphology of portions of two adjacent layers, with the boundaries between the adjacent layers along the build direction of the multi-layer engineered material; a 10 μm scale is provided for reference.

FIG. 11 is a BSED scanning electron micrograph taken as a transverse cross-sectional view in the radial direction through a section of a tube fabricated from ten layers 12, with each layer having well defined crystalline grains 14, and clearly demarcated interfacial regions 20 between adjacent pairs of layers 12. A 50 micrometer scale is shown in the lower right of the figure for reference purposes. FIG. 12 is a 5× magnification of a section of FIG. 11, also showing layers 12 of the inventive material, with columnar crystalline grains 14 within each layer 12 and well demarcated interfacial regions 20 between adjacent layers. The crystalline grains 12 predominantly have a build direction length that extends the entire depth of each of the layers 12, and extending substantially between each of the interfacial regions 20 bounding each layer 12. A 10 micrometer scale is provided for reference in the lower right of FIG. 12.

Figure 13:
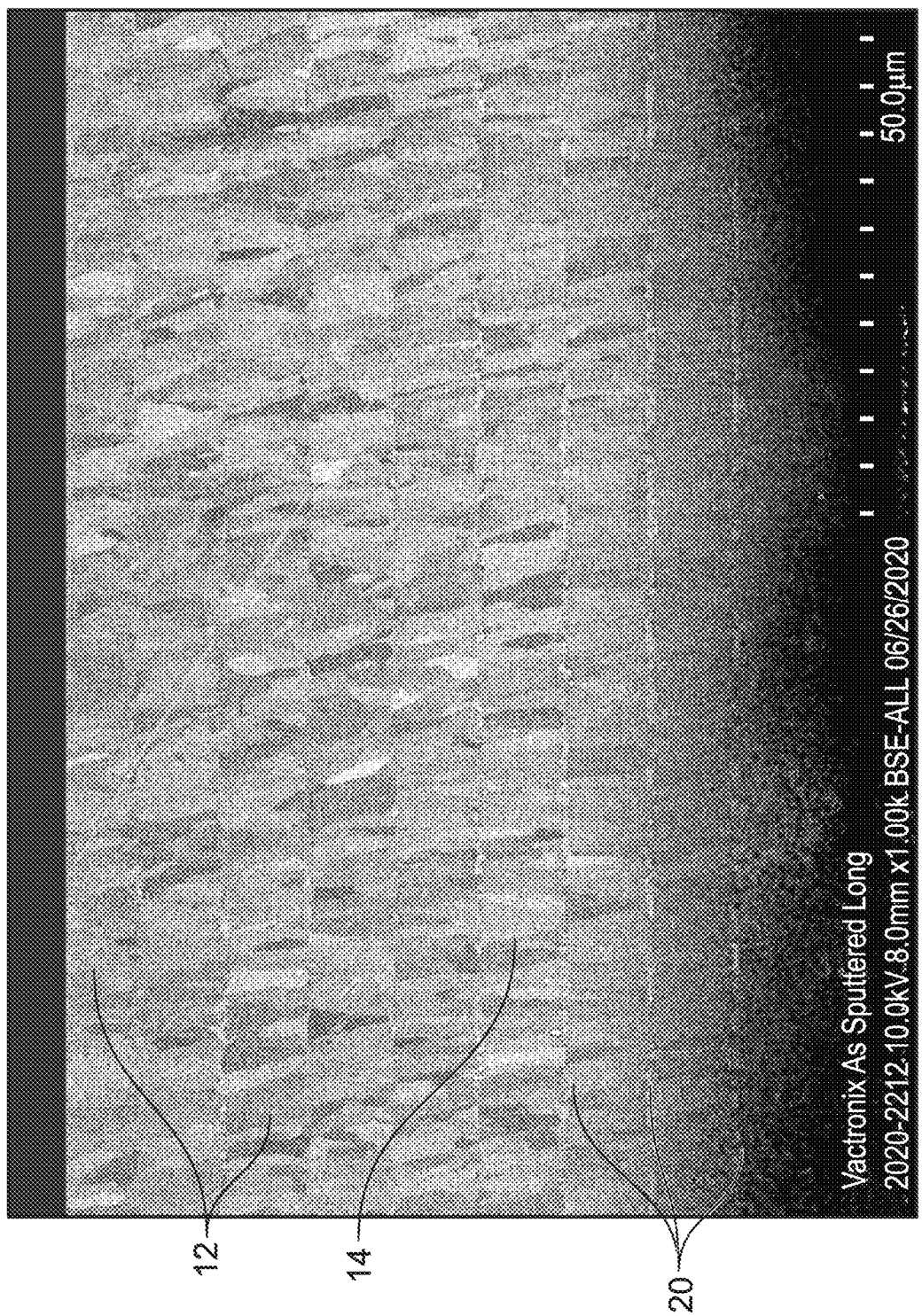
FIG. 13 is a BSE micrograph taken at 1000× magnification of a transverse crosssection of a tubular multi-layer engineered material in accordance with the present invention illustrating ten individual layers and the boundaries between adjacent individual layers; the upper surface is the build direction outer surface and the lower surface is the substrate interface; a 50 μm scale is provided for reference purposes.
Figure 14:
FIG. 14 is an enlarged BSE micrograph taken at 5000× magnification of FIG. 13 showing the crystal grain morphology of a portion of one layer and the crystal grain morphology of portions of two adjacent layers, with the boundaries between the adjacent layers along the build direction of the multi-layer engineered material; a 10 μm scale is provided for reference.

FIG. 13 is a BSED scanning electron micrograph taken as a transverse cross-sectional view in the longitudinal direction through a section of the same tube depicted in FIGS. 11 and 12. As in FIGS. 11 and 12, the tube illustrate in FIG. 13 is fabricated from ten layers 12, with each layer having well defined crystalline grains 14, and clearly demarcated interfacial regions 20 between adjacent pairs of layers 12. A 50 micrometer scale is shown in the lower right of the figure for reference purposes. FIG. 14 is a 5× magnification of a section of FIG. 13, also showing layers 12 of the inventive material, with columnar crystalline grains 14 within each layer 12 and well demarcated interfacial regions 20 between adjacent layers. The crystalline grains 12 predominantly have a build direction length that extends the entire depth of each of the layers 12, and extending substantially between each of the interfacial regions 20 bounding each layer 12. Dimensions for crystalline grains 12 in layer 12a are shown, with a crystalline grain 14a having a build direction length of 8.86 micrometers and another crystalline grain 14c having a width in the longitudinal axis of the material 10 of 1.11 micrometers. Another crystalline grain 14b in adjacent layer 12b, which is positioned adjacent the measured crystalline grain 14 in layer 12a has a width in the longitudinal direction of 3.24 micrometers. A 10 micrometer scale is provided for reference in the lower right of FIG. 14.

Figure 15:
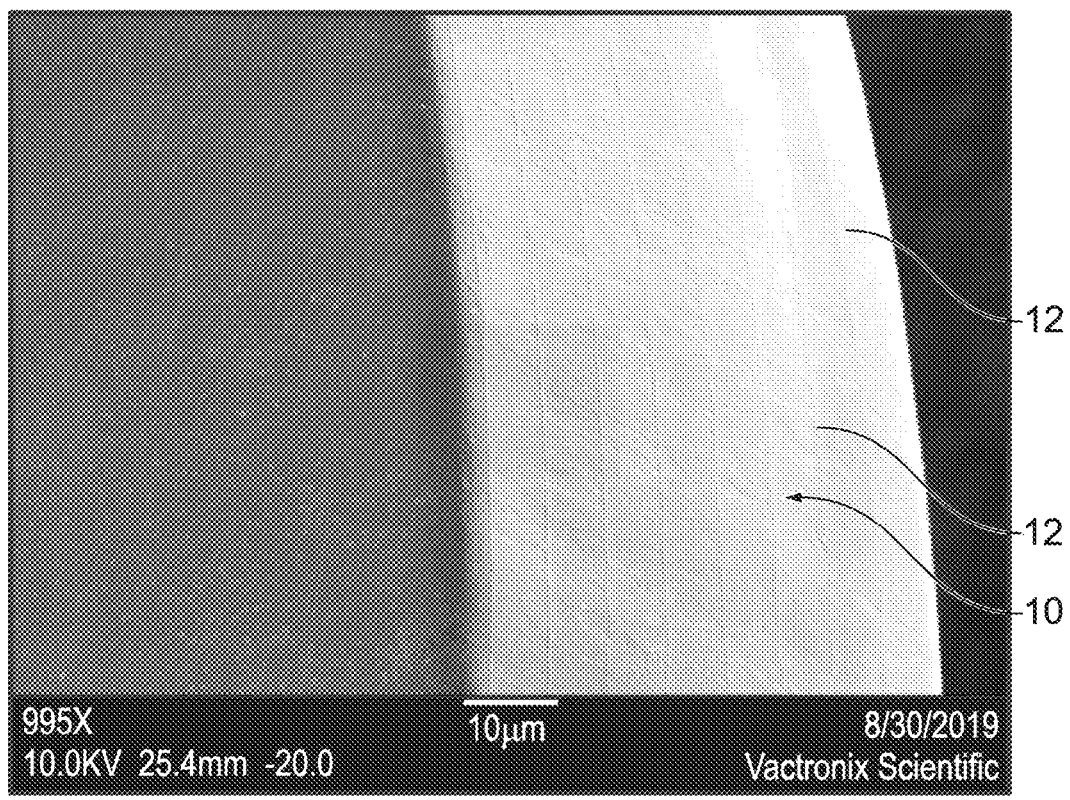
FIG. 15 is a scanning electron micrograph showing a perspective view illustrating the multi-layer engineered material formed into a finished medical stent-like device; a 10 μm scale is provided for reference purposes.

Turning to FIG. 15, a scanning electron micrograph taken at 995× magnification shows the multi-layer construct of the material 10 in a perspective view of an end edge of a curved section of the material 10. Individual layers 12 are clearly demarcated and visible in the material 10.

Figure 16A:
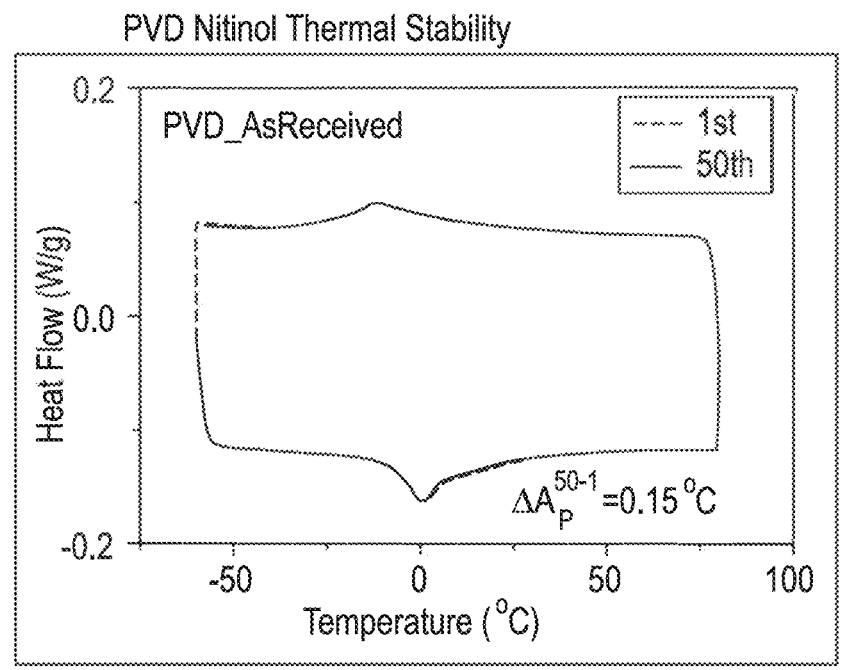
FIG. 16A is a differential scanning calorimetry graph showing the thermal stability of the inventive multi-layer engineered nickel-titanium material over fifty thermal cycles.
Figure 16B:
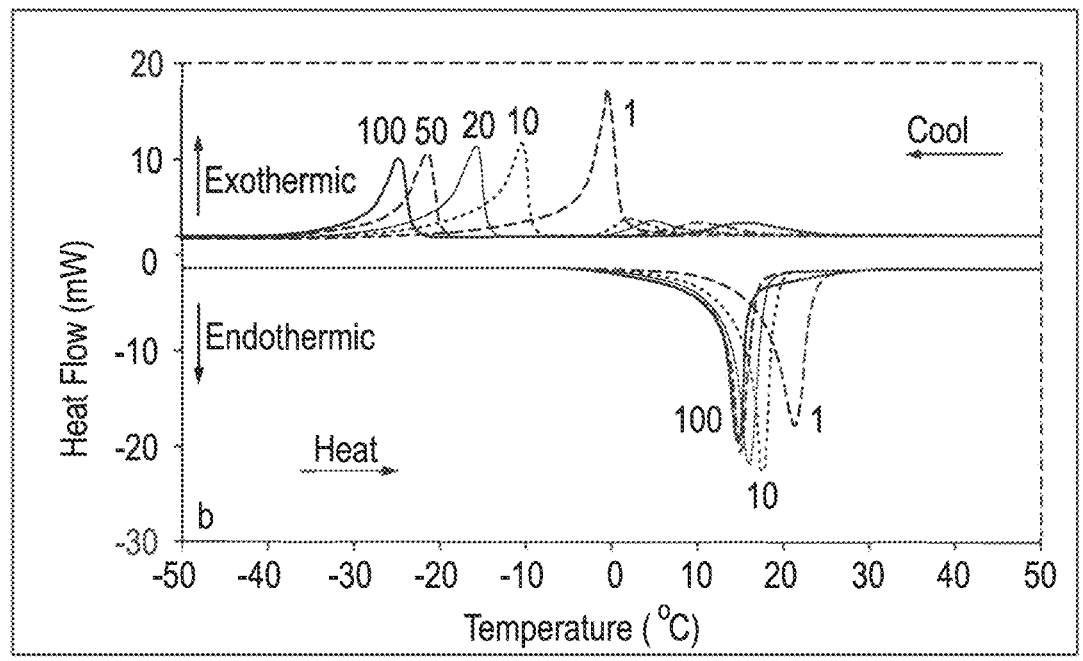
FIG. 16B is a differential scanning calorimetry graph showing the thermal stability of a conventional wrought nitinol material.
Figure 17:
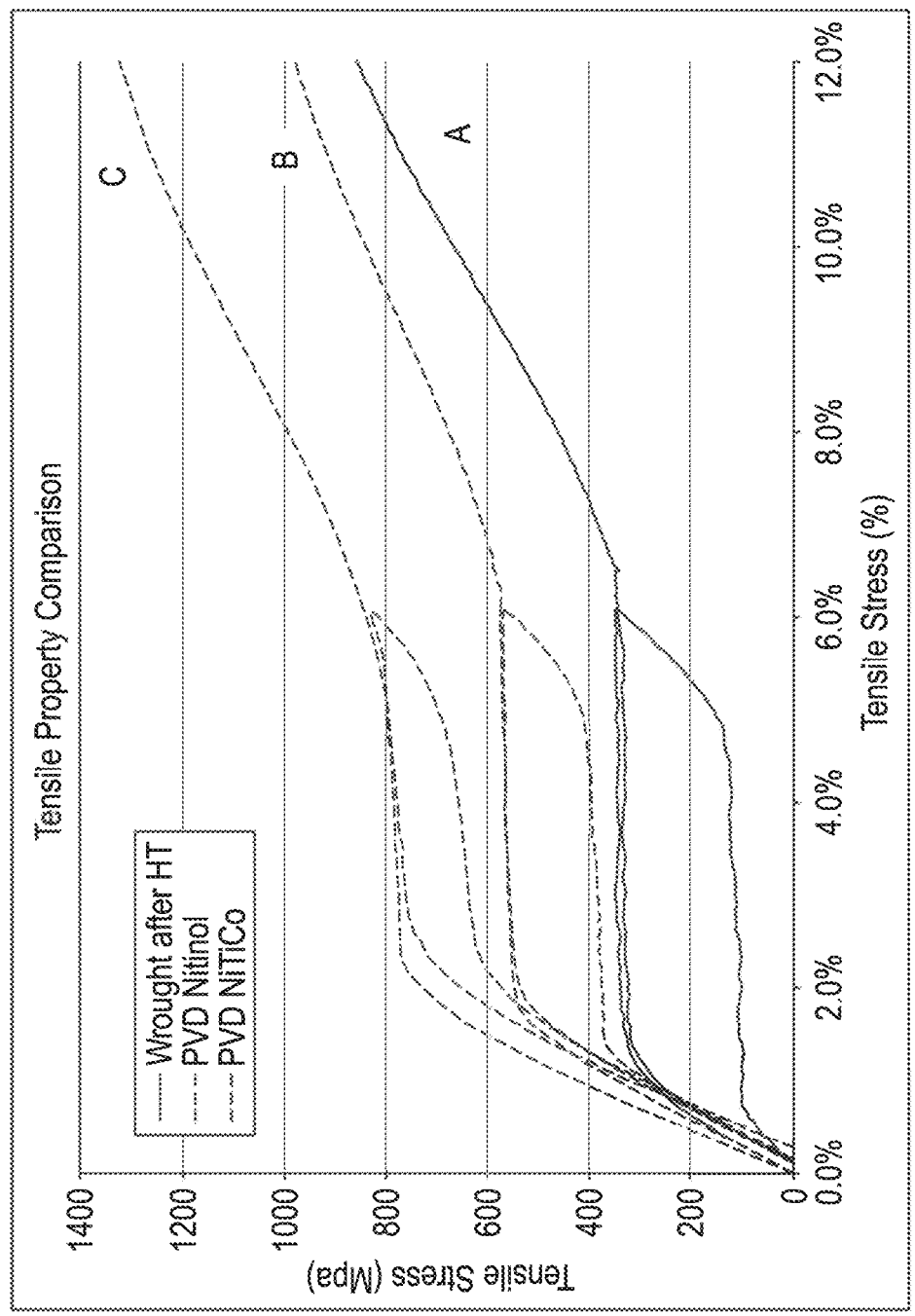
FIG. 17 is a graph depicting the tensile property comparison between wrought nitinol material after heat treatment in curve A, the inventive multi-layer PVD deposited nitinol engineered material in curve B, and the inventive multi-layer PVD deposited PVD deposited nickel-titanium-cobalt alloy in curve C.

FIGS. 16A and 16B are differential scanning calorimetry curves illustrating the thermal stability difference between a Nitinol sample of the inventive material 10 depicted in FIG. 16A and a sample of wrought nitinol. The inventive material 10 exhibits substantially identical thermal stability across fifty thermal cycles, whereas the wrought material tested in FIG. 16B exhibits a high degree of thermal shift between cycles 1 and 10, then again between cycles 10 and 20, and yet again between cycles 20 and 50. This comparison a vacuum deposited Nitinol material of the present invention and a conventionally made wrought Nitinol material demonstrates substantially uniform thermal stability over multiple thermal cycles and a substantial instability or shift of conventional wrought Nitinol material FIG. 17 is a graph comparing the tensile properties of wrought Nitinol after heat treatment, i.e., after crystallization of the large-grained, tempered structure of the wrought Nitinol, in curve A, of a sputter deposited Nitinol material of the present invention in curve B, and of a sputter deposited nickel-titanium-cobalt alloy material of the present invention in curve C. Not only do both the binary and ternary materials exhibit greater tensile stress plateaus than wrought Nitinol, the recovery curves have smaller areas indicating more efficient recovery and loading than is found with the wrought Nitinol.

As is shown in FIG. 17, the multi-layer material of the present disclosure exhibits a tensile stress loading plateau between about 550 MPa and about 800 MPa at between about 1.7% to about 5% tensile stress, as well as a recovery energy between about 300 MPa and about 800 MPa. These tensile stress plateaus and recovery energy are characteristic of both binary and ternary nickel-titanium alloys.

Figure 18A:
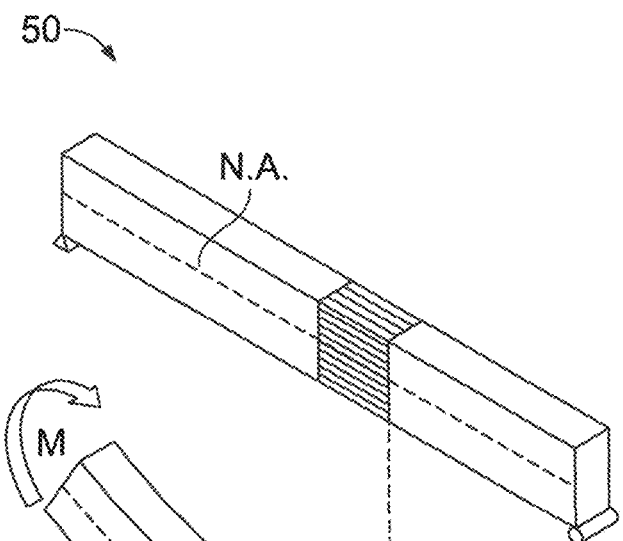
FIG. 18A is an illustrative view of an exemplary beam of a material showing it in an unstrained state.
Figure 18B:
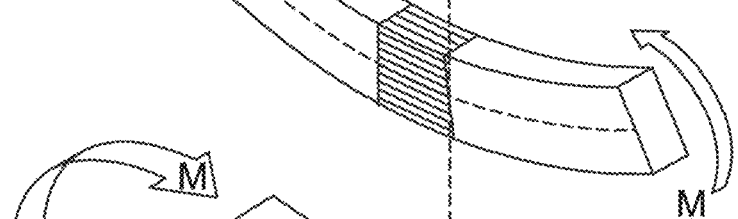
FIG. 18B is an illustrative view of the exemplary beam of a material with a bending moment M applied to opposing ends of the material.
Figure 18C:
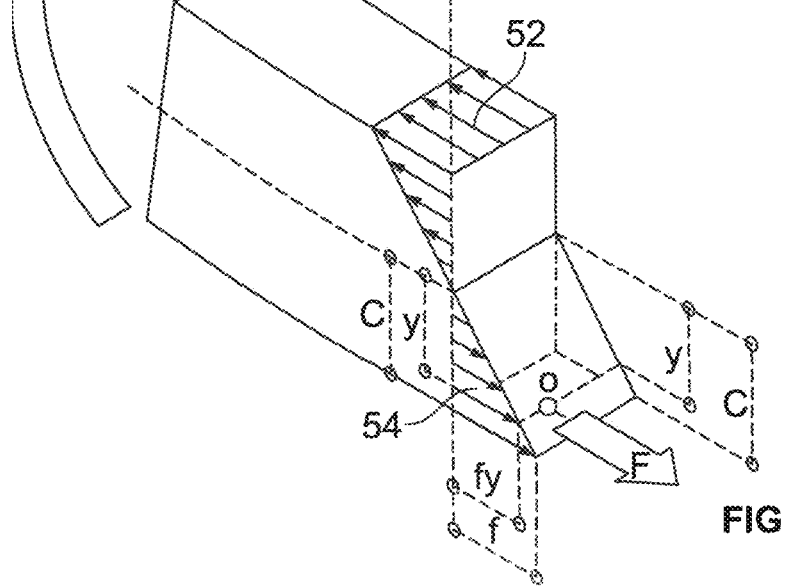
FIG. 18C is an illustration of stress vectors in a section of the exemplary beam of a material when bending moment M is applied and showing the magnitude of stress vectors from the neutral axis of the material extending longitudinally in opposite directions from the neutral axis and in magnitude throughout the Z-axis thickness from the neutral axis of the material.

FIGS. 18A-18C illustrate the principals of stress dispersion perpendicular to the neutral axis (N.A.) of a bar material 50 subjected to a bending force M. When a bending force M is applied at opposing ends of a bar material 50, there is a region of compression 52 of the material and a region of tension 54 of the material, each of which has opposite stress vectors F parallel to a neutral axis of the material 50. The stress vectors increase perpendicular to either side of the neutral axis NA of the material 50, as indicated by increasing length arrows on either size of the neutral axis NA. The multi-layer material of the present invention disperses these stress vectors across each of the multi-layers and bond layers, rather than in the Z-axis of the material as would be the case in a homogeneous wrought material.

Figure 19:
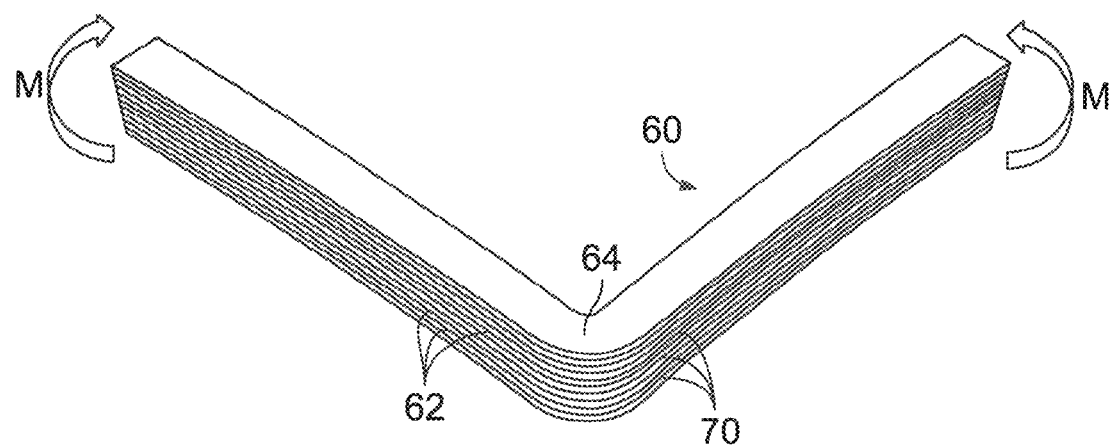
FIG. 19 is a diagrammatic illustration of an angled beam of the multi-layer material of the present invention, with bending moment M applied to opposing ends of the beam material.

FIG. 19 depicts a multi-layered bar material 60 having plural layers 62 separated by bond layers 70, as described for the material of the present invention. The material 60 is formed into a right angle, similar to a hinge region 64 of an intraluminal stent. When bending moments M are applied to each end of the multi-layered bar material 60, the hinge region 64 of the material is subjected to the same compression and tension forces, with the compressive stress being present at the included angle of the hinge region 64 and the expansive stress being present at the excluded angle of the hinge region 64.

Figure 20:
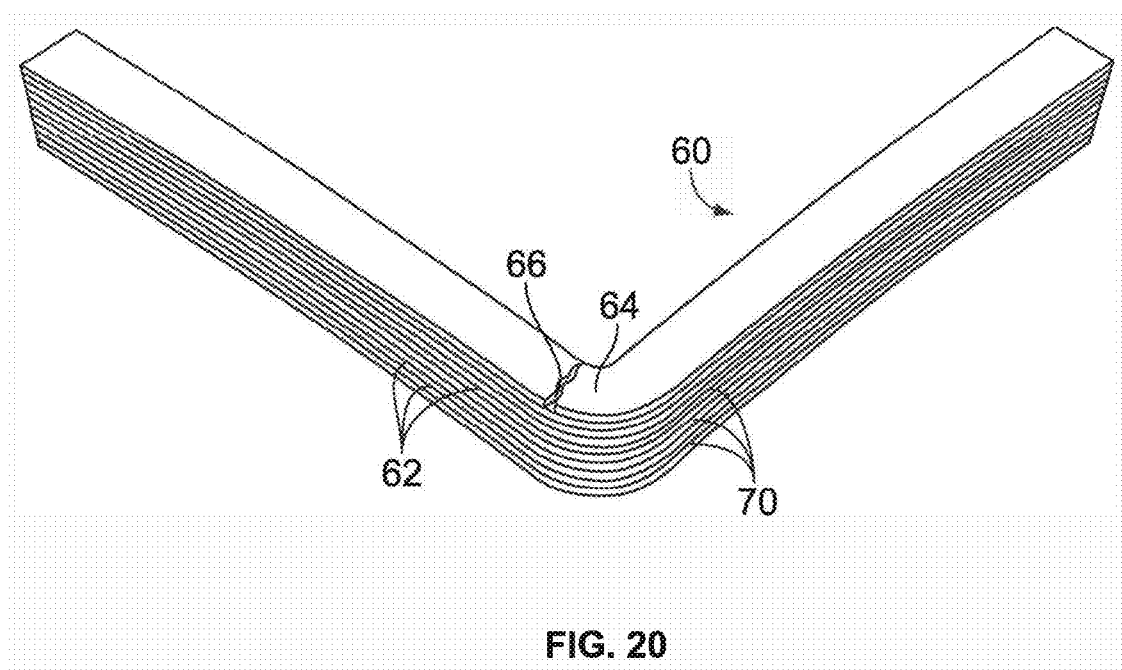
FIG. 20 is a diagrammatic illustration of a single layer failure of the angled beam of the multi-layer material of the present invention that occurred during application of bending moment M to opposing ends of the beam material.

FIG. 20 illustrate failure of a single layer in the multi-layered bar material illustrated in FIG. 19, after multiple cycles of a bending force M applied to each end of the multi-layered bar material 60. The failure crack 66 occurred in a single layer 62 of the material and did not propagate to either adjacent or remote layers 62 from the layer 62 that failed.

Figure 21:
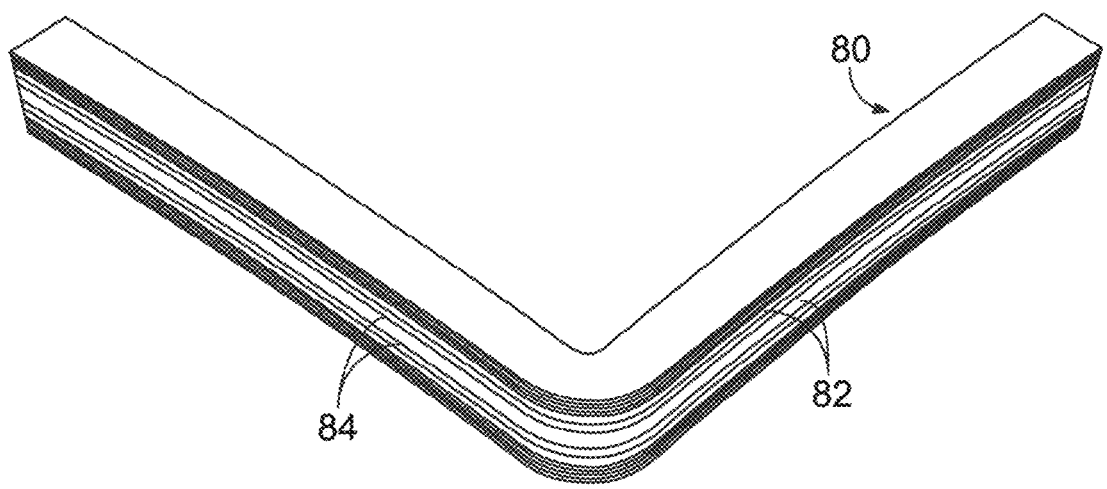
FIG. 21 is a diagrammatic illustration of an alternative embodiment of the multi-layer material of the present invention.
Figure 22:
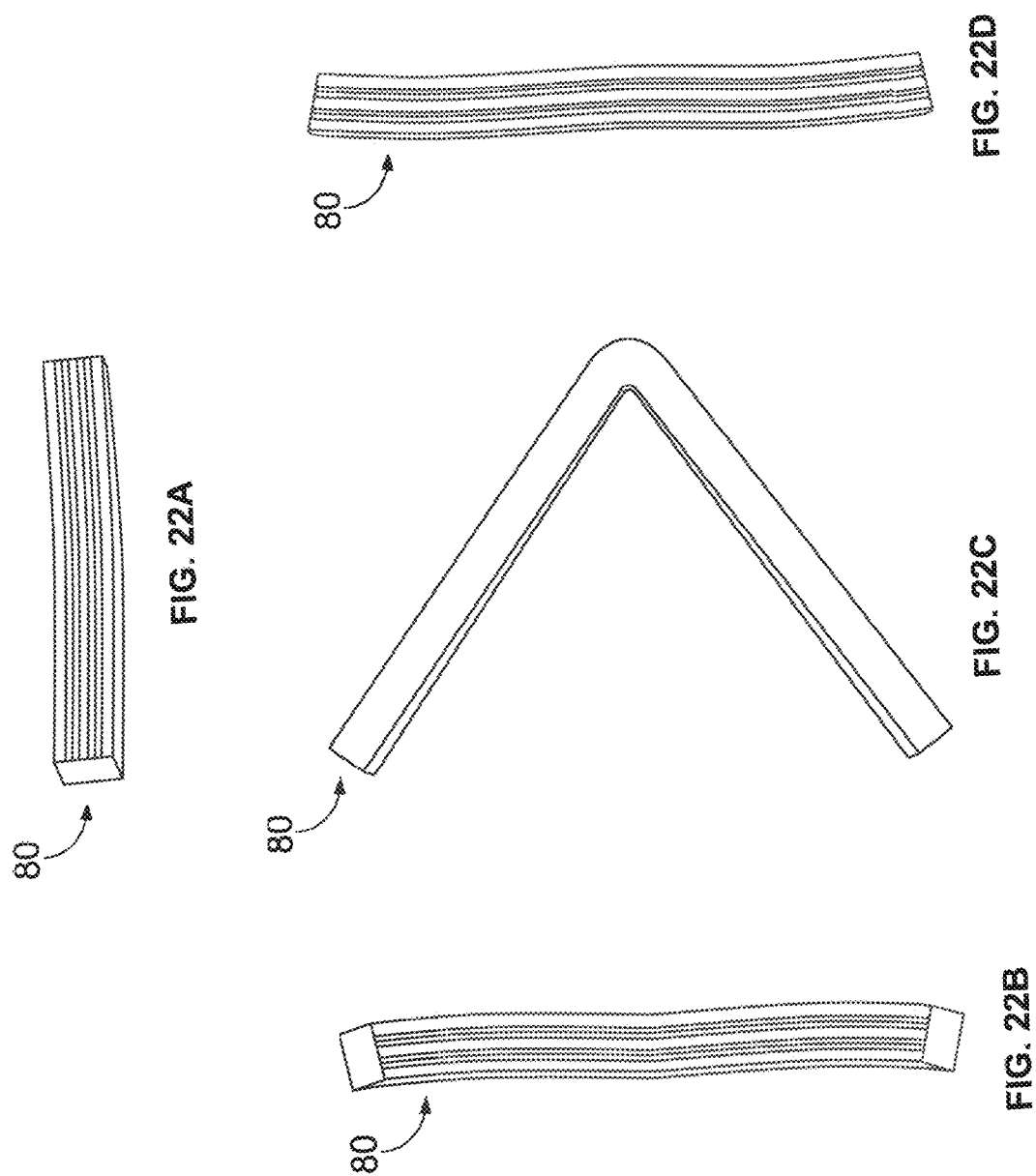
FIG. 22A is a side elevational view of the multi-layer material of FIG. 21.
FIG. 22B is a side elevational view taken from the included angle perspective of the multi-layer material of FIG. 21.
FIG. 22C is a top elevational view of the multi-layer material of FIG. 21.
FIG. 22D is a side elevational view taken from the excluded angle perspective of the multi-layer material of FIG. 21.

FIG. 21 depicts an alternative embodiment of the multi-layer material 10 of the present invention in which the material has plural layers of differing thickness. In the illustrated embodiment, the material 10 has a central layer along the neutral axis of the material that has the greatest thickness, with one or more shoulder layers bounding the central layer having a relatively lesser thickness than the central layer, and then one or more outer layers bounding each of the shoulder layers along the build direction or Z-axis thickness of the multi-layer material 10. This particular exemplary configuration allows the thinnest outer layers to act as the initial stress dispersion layers and, if a failure occurs, it will occur in the thinnest outer layers. The relatively thicker should layers and central layer, being more robust and closer to the neutral axis of the material, are subjected to lower stress levels than the thinnest outer layers and, therefore, far less prone to failures. FIGS. 22A to 22D depict different axis views of the alternative multi-layer material 10 of FIG. 21.

Figure 23:
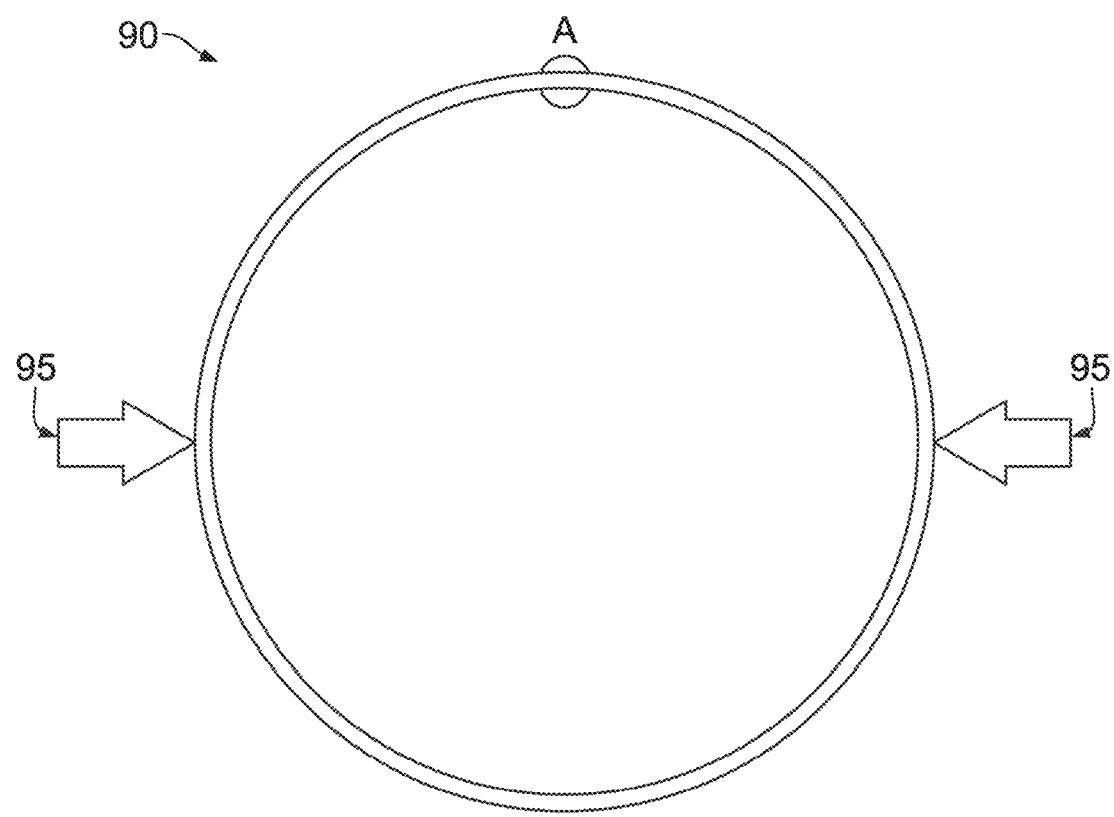
FIG. 23 is a diagrammatic illustration of a ring member made of the inventive multilayer material of the present invention, with a vector of bending force indicated by diametrically opposing arrows.
Figure 24:
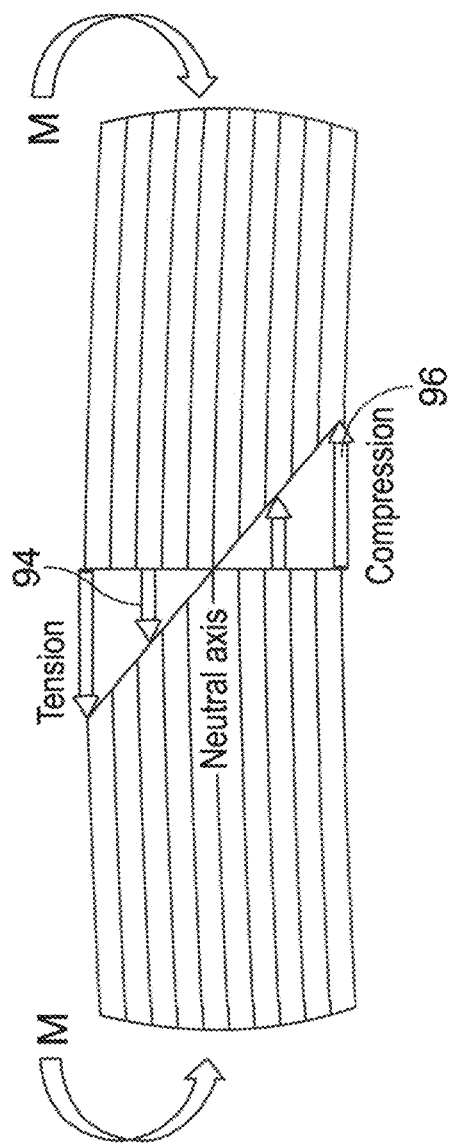
FIG. 24 is a sectional view taken from circle C in FIG. 23 showing the bending force M and the resulting stress propagation through the Z-axis thickness of the ring member.
Figure 25:
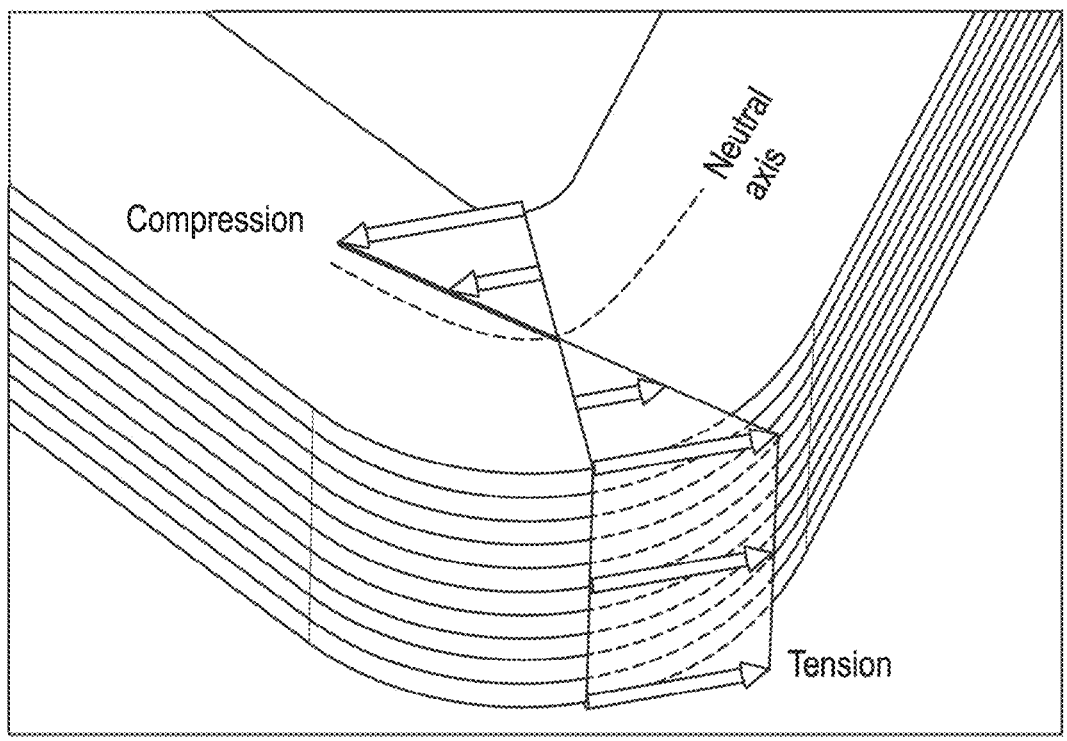
FIG. 25 is a diagrammatic illustration diagrammatic illustration of the angled beam and bending moment M of FIG. 19 illustrating the resulting stress propagation orthogonal to the layers of the angled beam.

FIG. 23 is an end elevational diagrammatic view of an annular member 90 made of the multi-layer material 10 of the present invention. Diametrically opposed arrows M 95, indicate the force vector of a bending force applied to the annular member 90. Upon application of bending force M to the annular member 90, FIG. 24 depicts the distribution of tension 94 and compression 96 forces across the neutral axis of the annular member 90 in Section A of FIG. 23, with tension 94 and compression 96 forces being disbursed through the thickness of the ring member in opposing directions relative to the neutral axis of the ring member.

A wide variety of devices may be made the take advantage of the inventive material's robust stress-strain profiles and the ability to engineer the materials' anisotropy to match fatigue resistance requirements of a particular device design. For examples, a typical failure point for an intraluminal stent is the formation of microcracks at hinge regions of the stent. By providing the inventive multi-layered material 10 to form stent structural members, such as stent struts or interconnecting member, any microcracks forming at the hinge regions of the stent will cause one or just a few of the layers to fail and the microcrack will not propagate to the remaining layers of the material thus preserving the integrity of the overall material from failing.

The following examples are provided in order to illustrate the alternative embodiments of the invention, and are not intended to limit the scope of the invention. In each of the following examples, the described general PVD equipment and process steps and parameters were employed. PVD was performed using a hollow cathode magnetron with the target material lining the inside of the process chamber. Interior to the targets was a carousel loaded with substrates. In the case of tubing, this is a planetary carousel. A suitable PVD reactor with a planetary carousel is described in U.S. Pat. No. 9,640,359 which is hereby incorporated by reference in its entirety. Substrates were typically constructed of polished metal with a diffusion barrier layer on it outer (deposition) surface. Substrates used were tubular, wire, profiled, and three-dimensional. After pumping down to a high vacuum pressure, e.g., <1E-6 Torr, an inert gas was introduced into the chamber at a controlled rate and the chamber pressure was controlled to a fixed level. Magnetic field and electrical potential was applied sufficient to ignite the plasma and generate process temperatures into a range that results in Zone 2 (columnar and most typical) or Zone 3 process temperatures in the Thornton diagram. The charged atoms (ions) from the plasma bombarded the target surface and ejected atoms of target material into the vacuum chamber. Using a DC electric field, the sputtered atoms from the targets were transported to the substrates where they organized into a crystalline structure. Electromagnets on the exterior of the chamber were used to shape the plasma profile to control the uniformity of deposition onto the substrates inside the chamber. Layers were created by interrupting the deposition process enough to initiate a new layer of deposited material or a "plane" of grains Plasma or pseudo-plasma etching. synonymously faux etching, was used at the start of a new layer to increase interlayer bond strength. This bond can also be intentionally weakened, if desired. PVD process parameters were driven by a table of values that were input to a PLC program which executed the process and recorded its outputs. Material properties, total deposition thickness, layer profile, property gradients, and final temper were all controlled by the PLC program and its input parameters. The material produced in this fashion was crystalline with final properties in the as-deposited configuration.

Individual layers or groupings of layers may be deposited to have different mechanical, electrical, chemical or physical properties by controlling the process parameters for each layer during the deposition.

It will be understood by those skilled the PVD arts, that deposition of films with different chemistries can also be achieved by manipulation of the sputter yields, in-situ doping, or by sequential depositions in different process chambers (or a multi-chamber system). Further material property manipulation can also be achieved post-deposition, if desired, by employing traditional heat treatment and/or working processes.

Example 1: Sputter Deposition of Multi-Layer NiTi Tubular Material

A cylindrical substrate was introduced into a deposition chamber with capabilities of glow discharge substrate cleaning and sputter deposition of nickel-titanium (NiTi) alloy. The deposition chamber was evacuated to a pressure less than or equal to $1\times10^{-6}$ Torr. The substrate temperature was controlled to achieve a temperature between about 300 and 1100 degrees Centigrade. A bias voltage between −1000 and +1000 volts, preferably between −200 and +10 volts, was applied to the substrate. Power was applied to the cathode to form a plasma within the deposition chamber. Power wattage may be varied to control the applied power and will vary depending upon the plasma conductance, inert gas flow, magnetron power settings, chamber cooling, and deposition chamber configuration, in such a manner to achieve a process temperature to deposit crystalline material.

During deposition, the deposition pressure was maintained between 0.1 and 10 mTorr. A sacrificial or barrier layer of substantially uniform thickness may, optionally, be deposited circumferentially on the substrate, alternatively the substrate, itself, may be sacrificial. NiTi alloy was deposited onto the cylindrical substrate at a deposition rate between about 5 to 8 microns/hour.

Example 2: Sputter Deposition of Multi-Layer NiTiCo Tubular Material

The same operating conditions was followed as in Example 1, except that the ternary alloy NiTiCo is employed as the target material and each layer was formed at 10-micron layers of NiTiCo.

Example 3: Sputter Deposition of Multi-Layer NiTi Non-Tubular Material

The same operating conditions were followed as in Example 1, except that a threedimensional substrate having a semilunar shape was introduced into the deposition chamber. Four successive NiTi layers of 3 microns thickness each were deposited onto the semilunar shaped substrate. The resulting deposited material was removed from the substrate by acid etching the substrate from the deposited material leaving the deposited semilunar shaped material.

Example 4: Sputter Deposition of Multi-Layer Tubular Materials of NiTi and Ta

The same operating conditions of Example 1 were followed to form a film having a 57 micron thickness, with one layer of NiTi deposited having 8-micron layer thickness, then one layer of Tantalum (Ta) was deposited having a thickness of 7-microns was deposited after the plasma was disrupted after the first NiTi layer was formed. Thereafter, five successive layers of 8 microns thickness each of NiTi were deposited as in Example 1.

Example 5: Sputter Deposition of Multi-Layer Materials Having Unequal Layer Thickness The same conditions are employed as in Example 1, except that the first five NiTi layers are deposited with a thickness of 3 microns each, the next five NiTi layers are deposited with a thickness of 10 microns each, and the next five NiTi layers are deposited with a thickness of seven microns each, for a total deposited material thickness of 100 microns. Layer thickness is controlled determining the deposition rate and limiting the duration of the plasma during each layer deposition run based upon the deposition rate.

Example 6: Property Gradient within a Layer of the Multi-Layer Material

The same conditions are employed as in Example 1, except that during deposition of at least one of the layers, at least one of the plasma power, bias, working gas, and/or chamber temperature are increased in a step-wise or linear manner. The resulting columnar crystalline grain morphology of the at least one layer will exhibit a tapered grain morphology within the at least one layer.

Example 7: Property Gradient Between Layers in the Multi-Layer Material

The same conditions are employed as in Example 1, except that after interrupting the deposition forming a first layer, at least one of the plasma power, bias, working gas, target metallic or pseudometallic species, and/or chamber temperature is changed prior to resuming deposition of an adjacent second layer onto the bond layer between the adjacent layers. The resulting columnar crystalline grain morphology of the at least first layer will be different from that of the adjacent second layer.

Example 8: Property Gradient Between Layers in the Multi-Layer Material

The same conditions are employed as in Example 1, except that during deposition of a first layer, the bias is changed in a step-wise of gradient manner, the deposition process is interrupted, a faux etch is performed on the first layer to form the bond region, and the deposition process is resumed to form the second layer while continuing to change the bias in a step-wise or gradient manner. The resulting crystalline grain morphology in each layer will exhibit a tapered morphology within each layer and across the bond layer to the adjacent layer.

It will be understood from the foregoing examples that a high level of control over the properties of the multi-layer material, either on an individual layer basis, on a layer-by-layer basis, on groupings of layers, or throughout the entire thickness of the multi-layer material are possible by adjusting different deposition process parameters either during deposition of a single layer, between adjacent layers, or across the deposition of the entire thickness of the multi-layer material. Control over at least one deposition process parameter, such as working gas, working gas pressure, pressure, substrate bias, plasma power and/or chamber temperature, allows formation of groupings of at least about eight to ten continuous elongate crystalline grains across to form features within each layer. These groupings of typically at least about eight to ten elongate crystalline grains act to distribute stress and strain to the multi-layer material across bond layers between adjacent layers of the multi-layer material.

Vacuum deposition technologies have been adapted to yield multi-layer metal structures with improved mechanical, chemical and physical properties. The multi-layer materials are capable of being engineered either on a layer-by-layer basis, groupings of layers, or as bulk materials properties to have defined and variable properties such as shape memory, radiopacity, corrosion resistance, fatigue resistance, fracture susceptibility, resistance to failure propagation, or the like. It will be understood that a wide variety of articles may be made employing the inventive multi-layer materials, including, without limitation, implantable medical devices, aerospace materials, automotive materials, electromechanical devices, each of which will have different material, chemical and physical property constraints depending upon the application of the device and device material.

While the invention has been described with reference to its preferred embodiments, those of ordinary skill in the relevant arts will understand and appreciate that the present invention is not limited to the recited preferred embodiments, but that various modifications in material selection, deposition methodology, manner of controlling the grain formation within individual layers, across multiple layers, or throughout the entire thickness of the multi-layer material, and deposition process parameters may be employed without departing from the invention, which is to be limited only by the claims appended hereto.

What is claimed is:

1. A method of making a multi-layered metal material, comprising the steps of:
    a. sputter depositing a first layer of a nickel-titanium alloy crystalline metal material having a crystal grain structure throughout the bulk of the first layer of crystalline metal material in which crystal grains are orthogonally oriented relative to an outer surface of the first layer of crystalline metal material;
    b. interrupting the sputter deposition of the first layer of nickel-titanium alloy crystalline metal material; and
    c. sputter depositing a second layer of nickel-titanium alloy crystalline metal material having a crystal grain structure throughout the bulk of the second layer of crystalline metal material in which crystal grains are orthogonally oriented relative to an interface bond region between the first layer of nickel-titanium alloy crystalline metal material and the second layer of crystalline metal material;
    d. wherein the resulting multi-layered anisotropic metal material is characterized by having physical anisotropic properties.

2. The method of claim 1, wherein the first layer of a nickel-titanium alloy crystalline metal material and the second layer of nickel-titanium alloy crystalline metal material are the same metal materials.

3. The method of claim 1, wherein the first layer of a nickel-titanium alloy crystalline metal material and the second layer of a nickel-titanium alloy crystalline metal material are different metal materials.

4. The method of claim 2, wherein the first layer of nickel-titanium alloy crystalline metal material and the second layer of nickel-titanium alloy crystalline metal material are each binary, ternary, or quaternary alloys of nickel-titanium.

5. The method of claim 3, wherein the first layer of nickel-titanium alloy crystalline metal material and the second layer of nickel-titanium alloy crystalline metal material are each binary, ternary, or quaternary alloys of nickel-titanium.

6. The method of claim 1, wherein the step of interrupting the sputter deposition further comprises, individually or in combination, the step of lowering an applied voltage, lowering a vacuum pressure within a sputter deposition chamber, lowering a plasma pressure within the sputter deposition chamber, changing an applied electrical bias, and/or changing a temperature within the sputter deposition chamber.

7. The method of claim 1, wherein the step of sputter depositing a first layer of nickel-titanium alloy crystalline metal material further comprises the step of sputter depositing the first layer of nickel-titanium alloy crystalline metal material onto a cylindrical substrate while rotating the cylindrical substrate.

8. The method of claim 7 wherein the step of sputter depositing a second layer of nickel-titanium alloy crystalline metal material further comprises sputter depositing the second layer of nickel-titanium alloy crystalline metal material onto the first layer of metal material while rotating the cylindrical substrate.

9. A method of controlling isotropy or anisotropy physical properties in a metallic material, comprising the steps of sputter depositing a multi-layer nickel-titanium alloy material having a crystal grain structure within each layer and a bonding layer between each of the layer of the multi-layer material, wherein the bonding layer is oriented orthogonal to a growth direction of the crystal grain structure, and wherein the metallic material exhibits physically anisotropic properties.

10. The method of claim 9, wherein the multi-layer material has a tubular or annular shape.

11. The method of claim 10, wherein the bonding layer between each layer of the multi-layer material is oriented substantially parallel to a neutral axis of the multi-layer material.

12. The method of claim 9, further comprising the steps of: sputter depositing a first layer of a crystalline metal material having a crystal grain structure throughout the bulk of the first layer of the nickel-titanium alloy crystalline metal material in which crystal grains are orthogonally oriented relative to an outer surface of the first layer of a nickel-titanium alloy crystalline metal material; interrupting the sputter deposition of the first layer of nickel-titanium alloy crystalline metal material; forming the bonding layer on the first layer of nickel-titanium alloy crystalline metal material; and sputter depositing a second layer of nickel-titanium alloy crystalline metal material having a crystal grain structure onto the bonding layer.

13. The method of claim 12, further comprising the step of forming a second bond layer on the second layer of nickel-titanium alloy crystalline material and depositing a third layer of nickel-titanium alloy crystalline metal material onto the second bond layer.

14. The method of claim 13, wherein the steps of forming the bond layer and the steps of sputter depositing a layer of nickel-titanium alloy crystalline metal material are repeated until a desired thickness of the metallic material is achieved.

15. The method of claim 9, wherein each of the layers of the multi-layer material have substantially equal thickness.

16. The method of claim 9, wherein at least some of the layers of the multi-layer material have different thicknesses.

17. The method of claim 9, wherein at least some of the layers of the multi-layer material are made of a first nickel-titanium alloy metal and at least some of the layers of the multi-layer material are made of a second nickel-titanium alloy metal different from the first nickel-titanium alloy metal.

18. The method of claim 9, wherein the at least some of the layers of the multi-layer material have grain structures different than other layers of the multi-layer material.

19. The method of claim 9, wherein the multi-layer material has a greater number of layers in regions of the material subject to highest fatigue strain.

20. The method of claim 9, wherein at least some of the layers in the multi-layer material have a lower crystalline grain density than other layers in the multi-layer material.

21. The method of claim 20, wherein the at least some of the layers in the multi-layer material with a lower crystalline grain density are positioned in higher shear stress regions of the multi-layer material.

22. The method of claim 9, wherein the step of providing a multi-layer material further comprises the steps of sputter depositing a first layer of the multi-layer material and then or sputter depositing a second layer of the multi-layer material and wherein the sputter depositing steps further comprise the steps of controlling at least one sputter deposition process parameter selected from the group of inert gas pressure, substrate bias, plasma power and chamber temperature, and forming a grouping of at least eight continuous elongate crystalline grains across each dimension of the first layer or the second layer.

23. The method of claim 22, wherein the grouping of least eight elongate crystalline grains act to distribute stress and strain applied to the multi-layer material across bond layers adjacent to the first and/or second layer.

24. The method of claim 9, wherein the multi-layer material is a superelastic material exhibiting a tensile stress loading plateau between about 550 MPa and about 800 MPa.

25. The method of claim 24, wherein the superelastic material further exhibits a recovery energy between about 300 MPa and about 600 MPa.

* * * * *